United States Patent
Sato

[11] Patent Number: 5,966,319
[45] Date of Patent: Oct. 12, 1999

[54] STATIC MEMORY DEVICE ALLOWING CORRECT DATA READING

[75] Inventor: Hirotoshi Sato, Hyogo, Japan

[73] Assignee: Mitsubishi Denki Kabushiki Kaisha, Tokyo, Japan

[21] Appl. No.: 09/009,162

[22] Filed: Jan. 20, 1998

[30] Foreign Application Priority Data

Jul. 15, 1997 [JP] Japan .................................. 9-189763

[51] Int. Cl.$^6$ ............................................. G11C 11/00
[52] U.S. Cl. .......................... 365/154; 365/156; 365/190; 365/177
[58] Field of Search .................................. 365/154, 156, 365/190, 203, 177

[56] References Cited

U.S. PATENT DOCUMENTS

| | | |
|---|---|---|
| 4,868,628 | 9/1989 | Simmons . |
| 5,063,540 | 11/1991 | Takahashi ........................... 365/190 X |
| 5,483,483 | 1/1996 | Choi et al. . |
| 5,508,961 | 4/1996 | Han . |

FOREIGN PATENT DOCUMENTS

| | | |
|---|---|---|
| 4-285794 | 10/1992 | Japan . |
| 6-302191 | 10/1994 | Japan . |
| 7-226083 | 8/1995 | Japan . |

*Primary Examiner*—Huan Hoang
*Attorney, Agent, or Firm*—McDermott, Will & Emery

[57] ABSTRACT

A memory cell includes driver transistors constituting a cross coupled type flipflop, access transistors driven in response to a signal potential on a word line, and bipolar transistors for connecting the memory cell to bit lines. For the bit lines, a read load circuit including diode coupled p channel MOS transistors and cross coupled p channel MOS transistors is provided, which supplies current when activated, and latches the bit line potentials after a prescribed time period. Stable data reading at high speed with low current consumption even under low power supply voltage is ensured, without causing data destruction.

20 Claims, 18 Drawing Sheets

STATIC MEMORY DEVICE ALLOWING CORRECT DATA READING

BACKGROUND OF THE INVENTION

1. Field of the Invention

The present invention relates to a semiconductor memory device and, more specifically, to a structure for reading data from a memory cell of a static semiconductor memory device.

2. Description of the Background Art

FIG. 22 schematically shows a structure of an array portion of a conventional static semiconductor memory device. FIG. 22 shows the structure of the array portion of a static random access memory (SRAM) which is one of the static semiconductor memory devices. In FIG. 22, the SRAM includes a plurality of memory cells M arranged in rows and columns, word lines WL arranged corresponding to respective rows of memory cells and having memory cells of the corresponding rows connected, and a plurality of bit line pairs BL, /BL arranged corresponding to respective columns of the memory cells and having memory cells of the corresponding column connected. FIG. 22 shows, as representatives, one word line WL1, bit line pairs BL1, /BL1 to BLn, /BLn, and memory cells M1 to Mn arranged corresponding to crossing points of these lines.

Each of the memory cells M1 to Mn includes an inverter latch formed by inverters 202 and 203 for storing information at storage nodes SN and /SN, and access transistors 204 and 205 which are rendered conductive in response to a signal potential on word line WL1 for connecting storage nodes SN and /SN to bit lines BL, /BL (BL1, /BL1 to BLn, /BLn), respectively. Access transistors 204 and 205 are formed of n channel MOS transistors (insulated gate type field effect transistors).

SRAM further includes bit line precharge/equalize circuits BEQ1 to BEQn provided corresponding to bit line pairs BLI, /BL1 to BLn, /BLn, respectively, and activated when a bit line equalize instructing signal /EQ is activated, for precharging and equalizing corresponding bit lines BL1, /BL1 to BLn, /BLn to the level of power supply voltage Vcc; column selection gates CSG1 to CSGn receiving a column selection signal Y (Y1 to Yn) from a column decoder, not shown, rendered conductive when the received column selection signal Y designates the corresponding bit line pair, for electrically connecting the corresponding bit line pairs BL1, /BL1 to BLn, /BLn to internal read data bus DB, /DB; and a sense amplifier 215 which is activated at the time of data reading, for amplifying signal potential on the internal read data buses DB, /DB, generating and transmitting to an output buffer circuit, not shown, an internal read data.

Each of the bit line precharge/equalize circuits BEQ1 to BEQn includes a p channel MOS transistor 206 which is rendered conductive when the bit line equalize instructing signal /EQ is activated, to transmit power supply voltage Vcc to the bit line BL (BL1 to BLn), a p channel MOS transistor 207 which is rendered conductive when the bit line equalize instructing signal /EQ is activated, to transmit power supply voltage Vcc to the bit line /BL (/BL1 to /BLn), and a p channel MOS transistor 208 which is rendered conductive when the bit line equalize instructing signal /EQ is activated, to electrically connect bit lines BL and /BL.

Each of the column selection gates CSG1 to CSGn includes an inverter circuit 210 for inverting the column selection signal Y (Y1 to Yn), a transmission gate 211 which is rendered conductive in accordance with the column selection signal Y and an output signal from inverter circuit 210, to connect the corresponding bit line BL (BL1 to BLn) to the internal read data bus DB, and a transmission gate 212 which is rendered conductive in accordance with the column selection signal Y and the output signal from inverter 210, to connect the corresponding bit line /BL (/BL1 to /BLn) to the internal read data bus /DB.

Sense amplifier 215 has a structure of a differential amplifier circuit such as shown, for example, in Japanese Patent Laying-Open No. 7-226083. The operation of the SRAM shown in FIG. 22 at the time of data reading will be described with reference to the diagram of signal waveforms of FIG. 23.

In data reading, bit line equalize instructing signal /EQ is driven to the inactive state of H level. In data writing, bit line equalize instructing signal /EQ is set to be and kept inactive for a prescribed time period, so that the bit line fully swings between the levels of the power supply voltage and the ground voltage in accordance with the write data. In data reading, bit line equalize/precharge circuits BEQ1 to BEQn have a function of making smaller the amplitude of the bit line potential and reading data at high speed.

When an address signal is applied, a row decoder and a column decoder, not shown, operate in accordance with the applied address signal, and the word line corresponding to the addressed row and the column selection signal corresponding to the addressed column are driven to the selected state. FIG. 23 shows an example in which word line WL1 is selected. In response to the rise of the potential on word line WL1, access transistors 204 and 205 of memory cells Ml to Mn connected to the word line WL1 are rendered conductive, and respective storage nodes SN and /SN are connected to the corresponding bit lines BL, /BL (BL1, /BL1 to BLn, /BLn). Bit line precharge/equalize circuits BEQ1 to BEQn are activated when the memory cell is not selected, and inactivated when the memory cell is selected. In accordance with the column selection signal Y, the bit lines corresponding to the selected column are connected to the internal read data bus DB, /DB. One of the storage nodes SN and /SN is at the H level and the other is at the L level.

Now, assume that memory cell Ml is selected and storage node SN stores data at the H level. In this state, a current (column current) flows from bit line /BL1 to storage node /SN, and the voltage level of bit line /BL1 lowers. Meanwhile, storage node SN stores the H level data, and the voltage level of bit line BL1 hardly changes. MOS transistor 208 in bit line precharge/equalize circuit BEQ1 prevents the potential difference between bit lines BL1 and /BL1 from becoming too large. The potential difference developed between bit lines BL1 and /BL1 is transmitted to internal read data bus DB and /DB through column selection gate CSG1. Sense amplifier 215 is activated at a prescribed timing, so that it amplifies the potential difference between internal read data bus DB and /DB and generates internal read data.

When reading of the memory cell data is completed, the selected word line WL1 attains to the inactive state of L level, and the column selection signal Y1 falls to the inactive state of L level. Consequently, bit lines BL1 and /BL1 are disconnected from internal read data bus DB and /DB, and bit lines BL1, /BL1 to BLn, /BLn are again precharged to the original level of the power supply voltage Vcc by corresponding bit line precharge/equalize circuits BEQ1 to BEQn.

FIG. 24 shows an example of a specific structure of the memory cells M1 to Mn shown in FIG. 22. In FIG. 24, reference character M generally represents a memory cell. In FIG. 24, memory cell M includes a resistance element 220 having high resistance connected between a power supply node and storage node /SN; a driver transistor 221 consisting of an n channel MOS transistor connected between storage node /SN and the ground node and having a gate connected to the storage node SN; a resistance element 222 having high resistance connected between the power supply node and storage node SN; a driver transistor 223 consisting of an n channel MOS transistor connected between storage node SN and the ground node and having a gate connected to storage node /SN; and access transistor 204 consisting of an n channel MOS transistor for connecting storage node SN to the bit line BL in response to the signal potential on the word line WL; and an access transistor 205 consisting of an n channel MOS transistor for connecting storage node /SN to the bit line /BL in response to the signal potential on word line WL. Resistance element 220 having high resistance and driver transistor 221 correspond to inverter 202 of the memory cell shown in FIG. 22, and resistance element 222 having high resistance and driver transistor 223 correspond to inverter 203 of the memory cell shown in FIG. 22.

When data at the H level is stored in storage node SN, driver transistor 221 is conductive, and storage node /SN is held at the level of the ground voltage. In this state, driver transistor 223 is non-conductive, and storage nodes SN and /SN are held at the H level and L level, respectively.

When resistance elements 220 and 222 are formed, for example, of polysilicon resistance, it is possible to form these resistance elements 220 and 222 having high resistance above driver transistors 221 and 223, and therefore it becomes possible to reduce an area occupied by the memory cells. The resistance value of these resistance elements having high resistance is sufficiently higher than ON resistance (channel resistance) of access transistors 204 and 205 as well as driver transistors 221 and 223. In order to surely hold the data stored in storage nodes SN and /SN when the word line WL is set to the selected state and access transistors 204 and 205 are rendered conductive, it is necessary that transfer factor βa (ratio of channel width Wa to channel length La) of access transistors 204 and 205 is set as large as at least three times the transfer factor βb of driver transistors 221 and 223. The necessity of making different the transfer factor β of access transistors and driver transistors will be described in the following.

FIG. 25A shows an inverter I, and FIG. 25B shows input/output transfer characteristics of inverter I. Inverter I inverts an input signal IN to produce an output signal OUT. The larger the gain of inverter I, the steeper the change in the curve representing input/output transfer characteristic shown in FIG. 25B. The gain of inverter I is determined by current drivability of the MOS transistors constituting the inverter.

FIG. 26A shows a structure of an inverter latch. The inverter latch is used in the SRAM cell shown in FIGS. 22 and 24. More specifically, inverter 202 inverts the signal potential on storage node SN for transmission to storage node /SN, while inverter 203 inverts the signal potential on storage node /SN for transmission it to storage node SN.

In FIG. 26B, curve A1 represents input/output transfer characteristic of inverter 202, while a curve A2 represents input/output transfer characteristic of inverter 203. When inverters 202 and 203 have the same input/output transfer characteristic, curve A2 is obtained by folding curve A1 along the dotted line shown in FIG. 26B. Crossing points S1 and S2 of curves Al and A2 are stable points of this inverter latch. A voltage corresponding to one of the states at stable points S1 and S2 appears at storage nodes SN and /SN.

For stable operation of the inverter latch, the curves shown in FIG. 26B must have two stable points S1 and S2. A point PM is a meta stable point. Even when nodes SN and /SN in the initial state are at potentials corresponding to a state near point PM, a certain noise shifts the latch state to stable point S1 or S2. In order to implement such a state that the inverter latch formed of inverters 202 and 203 stably operate as a flipflop to hold stably the potentials of storage nodes SN and /SN, a portion surrounded by curves A1 and A2 (defined as a static noise margin SNM) must be large. If this portion were small, curves A1 and A2 would be close to each other, and any point in such close portion would function as a false stable point, possibly causing a signal potential of at an arbitrary stable point to appear at storage nodes SN and /SN.

FIG. 27A shows a standby state (word line non-selected state) of a static memory cell. In FIG. 27A, access transistors 204 and 205 are non-conductive. In this state, storage nodes SN and /SN are connected to power supply nodes via high resistance elements 222 and 220. Resistance element 220 and driver transistor 221 constitute inverter 202, and resistance element 222 and driver transistor 223 constitute inverter 203. In the inverter employing the high resistance elements, the output node is rapidly discharged when the driver transistor is rendered conductive (current supplying capability of high resistance element is extremely small). Therefore, in this case, input/output transfer characteristic of the inverter latch has extremely steep transition portion allowing stable holding of data, as shown in FIG. 27B.

FIG. 28A shows a state of the static memory cell when the word line is in the selected state. In this state, access transistors 204 and 205 are rendered conductive, and storage nodes SN and /SN are connected to the corresponding bit lines BL and /BL, respectively. A current flows from the corresponding bit line to that one of the storage nodes SN and /SN which holds the potential of L level. This state is equivalent to a structure in which a load of low impedance is connected in parallel to the high resistance element, and therefore, equivalent to a structure in which high resistance elements 220 and 222 are not present. Therefore, in this state, inverters 202 and 203 must be treated as NMOS enhancement type load inverters using access transistors 204 and 205 as loads. In this case, a current is supplied from the NMOS enhancement type load transistor, the change at the transition portion of the input/output transfer characteristic is more moderate and the gain is lower, as compared with the case where high resistance element is used. Accordingly, the area surrounded by the curves A1 and A2 becomes smaller and, the static noise margin becomes smaller, as shown in FIG. 28B.

Assume that access transistors 204 and 205 and driver transistors 221 and 223 have the same current drivability. In this state, the amount of current discharged by the driver transistor which is conductive (for example, transistor 223) is the same as the amount of current supplied by the access transistor (for example, transistor 204), the input/output transfer characteristic of inverters 202 and 203 is extremely moderate, and curves A1 and A2 nearly attain such a state that only one stable point is present, as shown in FIG. 28C. More specifically, when the access transistor and the driver transistor have the same current drivability, the access transistor and the driver transistor holding data of L level come to have the same conductance when the word line is selected. Therefore, the potential of the storage node holding the L level data rises, the other driver transistor holding the H level data is rendered conductive, and the potential of the storage node storing the H level data is lowered.

Stable points S1 and S2 are operation points of the flipflop constituted by the inverters, and the flipflop is held in either one of these states. Accordingly, when input/output transfer characteristic changes as shown in FIG. 28C, bistable point disappears (only a monostable point is present), and the data held in storage nodes SN and /SN are destroyed when the word line is selected. Therefore, in order to ensure two stable points in the input/output transfer characteristic of the inverter latch, it is necessary to prevent the potentials of storage nodes SN and /SN from shifting to the intermediate potential level. In other words, it is necessary to make smaller the ratio between conductances of access transistor and driver transistor. Namely, it is necessary to set current drivability (conductance) of the driver transistor larger than the current drivability (conductance) of the access transistor.

The current drivability (conductance) of the MOS transistor is in proportion to the ratio (transfer factor) β of channel width W to channel length L. The ratio (cell ratio) R of current drivability is set to a value between 3 to 4, as already described. Consequently, input/output transfer characteristics of the inverter is made relatively steep, so that two stable points are ensured and destruction of stored data at the time of data reading can be prevented.

In order to set transfer factor β of driver transistors 221 and 223 larger than that of access transistors 204 and 205, it is necessary to set channel widths of driver transistors 221 and 223 wider than those of access transistors 204 and 205. If channel length only is reduced, the short-channel effect occurs, so that the threshold voltage lowers and current consumption increases. Therefore, in order to hold data stably in the data read operation, driver transistors 221 and 223, must have sizes (ratios of channel width to channel length) larger than those of the access transistors. Accordingly, memory cell size (area of occupation) cannot be made small, which hinders higher integration.

Meanwhile, operational power supply voltage is made lower and lower to realize higher speed of operation and lower current consumption. In an MOS transistor, the higher the gate voltage, the larger drain current can be supplied. This is understood from the fact that drain current in the saturation region of the MOS transistor is represented by the following equation $$Ids = \beta (Vgs - Vth)^2$$

where Vgs represents gate-to-source voltage, and Vth represents a threshold voltage. Therefore, when the power supply voltage becomes lower, the gate-to-source voltage Vgs is reduced, and the amount of driven current decreases. As a result, transition of the input/output transfer characteristic of the inverter becomes slower, resulting in such input/output transfer characteristic as shown in FIG. 28C, possibly causing destruction of the stored data at the time of data reading.

Specially in this memory cell, current is always supplied through the resistance elements, and in order to reduce current consumption as much as possible, the threshold voltage of driver transistors 221 and 223 is made higher than that of the access transistor. Therefore, when the power supply voltage is made lower, difference between current drivability of conductive driver transistors 221 and 223 and current drivability of conductive access transistors 204 and 205 becomes smaller. Therefore, the change in the transition portion of curves A1 and A2 becomes extremely moderate as shown in FIG. 28D, resulting in a state in which there is not a stable point but only a quasi stable point. Accordingly, the stored data is destroyed when the word line is selected, and data cannot be read. Stable data holding is not ensured.

Further, column current flows from the bit line precharge/equalize circuit BEQ to the memory cell at the time of data reading, resulting in considerable current consumption.

SUMMARY OF THE INVENTION

An object of the present invention is to provide a static semiconductor memory device allowing sure and stable data holding even when power supply voltage is low.

Another object of the present invention is to provide a static semiconductor memory device allowing data reading at high speed with low current consumption without destruction of memory cell data even under low power supply voltage.

According to a first aspect of the present invention, the semiconductor memory device includes a word line, a pair of bit lines arranged crossing the word line, and a memory cell arranged corresponding to the crossing point of the word line and the pair of bit lines. The memory cell includes a cross coupled type flipflop for storing complementary data at a pair of storage nodes, a pair of bipolar transistors provided corresponding to the pair of bit lines respectively and each having one conduction node connected to the corresponding bit line, and a pair of access transistors for coupling the pair of storage nodes of the flipflop to the base electrodes of the pair of bipolar transistors respectively in response to the signal potential on the word line.

The semiconductor memory device according to the first aspect further includes a read load circuit coupled to the pair of bit lines, for reading and amplifying data in the memory cell to the pair of bit lines at the time of data reading. The read load circuit includes a pair of diode elements connected to the pair of bit lines, respectively, a pair of cross coupled transistors for differentially amplifying and latching potentials of the pair of bit lines, a first switching transistor for electrically connecting the pair of diode elements and a voltage source supplying a first power supply voltage, and a second switching transistor for electrically connecting the pair of cross coupled transistors and the voltage source.

According to a second aspect of the present invention, the semiconductor memory device includes a plurality of bit line pairs, a plurality of word lines arranged crossing the plurality of bit line pairs, and a plurality of memory cells arranged corresponding to the crossing points between the plurality of bit line pairs and the plurality of word lines. Each of the plurality of memory cells includes a cross coupled type flipflop for storing complementary data at a pair of storage nodes, a pair of bipolar transistors provided corresponding to respective bit lines of the corresponding bit line pair and each having one conduction node connected to the corresponding bit line, and a pair of access transistors for coupling the pair of storage nodes of the cross coupled type flipflop to the base electrodes of the pair of bipolar transistors in response to the signal potential of the corresponding word line.

The semiconductor memory device according to the second aspect further includes bit line selecting circuitry for selecting one of the plurality of bit line pairs in accordance with a bit line selecting signal, and read load circuitry for reading and amplifying data of the selected memory cell onto the selected bit line pair in data reading mode. The read load circuitry includes at least one read load circuit. The read load circuit includes a read load bus connected to the selected bit line pair, a pair of cross coupled transistor elements for differentially amplifying and latching a signal potential on the read load bus, a first switching element for connecting the diode element to a voltage source supplying a first power supply voltage at the time of data reading, and a second switching element for connecting the cross coupled transistor pair to the voltage source at the time of data reading.

In the memory cell, the bit line is connected to the flipflop through the bipolar transistor. Therefore, when the word line is selected, base current is applied through the bipolar transistor to the flipflop, and the current flowing to the flipflop is small. Thus, even when the transistor constituting the flipflop has small size, it can drive the storage node with sufficient margin, and therefore, destruction of memory cell data when the word line is selected can be prevented. Accordingly, data can be held stably even with low power supply voltage.

At the time of reading, the bit lines are driven to the level of the first power supply voltage through the diode element by means of the read load circuit, and potential difference derived from difference in amounts of current flowing through the bipolar transistors is amplified by the cross coupled transistor elements. Therefore, data can be read surely at high speed.

Further, by the cross coupled transistor elements, the bit line potential is fed back, controlling the amount of currents flowing through the bipolar transistors. Accordingly, a current flow to the data storage node storing L level data of the memory cells can be prevented, enabling stable data holding.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
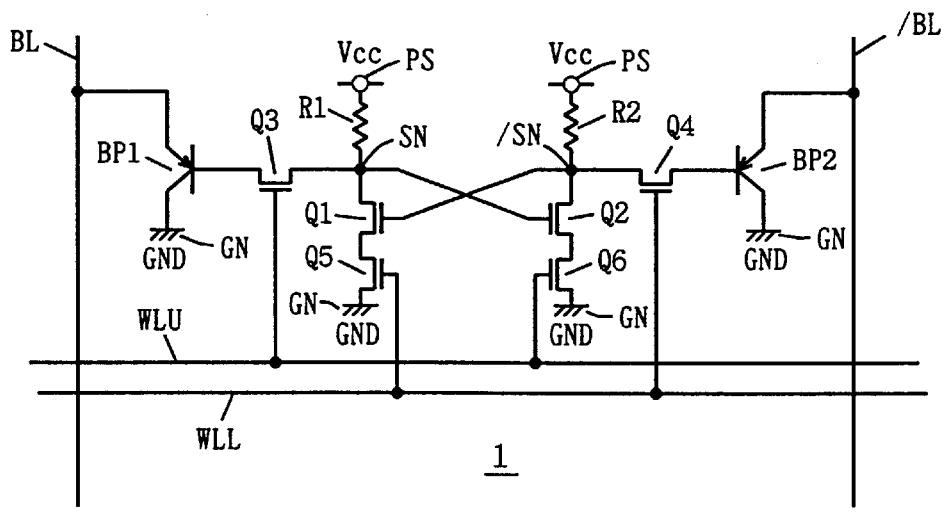
FIG. 1 shows a structure of the memory cell of the semiconductor memory device in accordance with a first embodiment of the present invention.

FIG. 1 specifically shows a structure of a memory cell of 1 bit of a static semiconductor memory device (SRAM) to which the present invention is applied. Referring to FIG. 1, the memory cell is arranged corresponding to a crossing portion of word lines WLU and WLL and a pair of bit lines BL and /BL. A column of memory cells are connected to the pair of bit lines BL and /BL and a row of memory cells are connected to the word lines WLU and WLL. Word lines WLU and WLL are arranged in a pair.

The memory cell includes a high resistance load element R1 connected between a power supply node PS as a voltage source supplying a first power supply voltage Vcc and a storage node SN; a high resistance load element R2 connected between power supply node PS and a storage node /SN; n channel MOS transistors (driver transistors) Q1 and Q2 cross coupled and constituting a flipflop, for holding data at storage nodes SN and /SN; n channel MOS transistors (access transistors) Q3 and Q4 for setting the memory cell to the selected state in response to signal potentials on word lines WLU and WLL; and n channel MOS transistors (cut transistors) Q5 and Q6 for selectively forming a current path between a ground node GN and driver transistors Q1 and Q2, in response to the signal potentials on word lines WLL and WLU.

Driver transistor Q1 has its gate connected to storage node /SN and its drain connected to storage node SN. Driver transistor Q2 has its gate connected to storage node SN and its drain connected to storage node /SN. Access transistor Q3 has its gate connected to word line WLU, and has one conduction node connected to storage node SN. Access transistor Q4 has its gate connected to word line WLL and one conduction node connected to storage node /SN. Cut transistor Q5 has its gate connected to word line WLL, its drain connected to the source of driver transistor Q1 and its source connected to the ground node GN. Cut transistor Q6 has its gate connected to word line QLU, its drain connected to the source of driver transistor Q2 and its source connected to the ground node GN.

Figure 2:
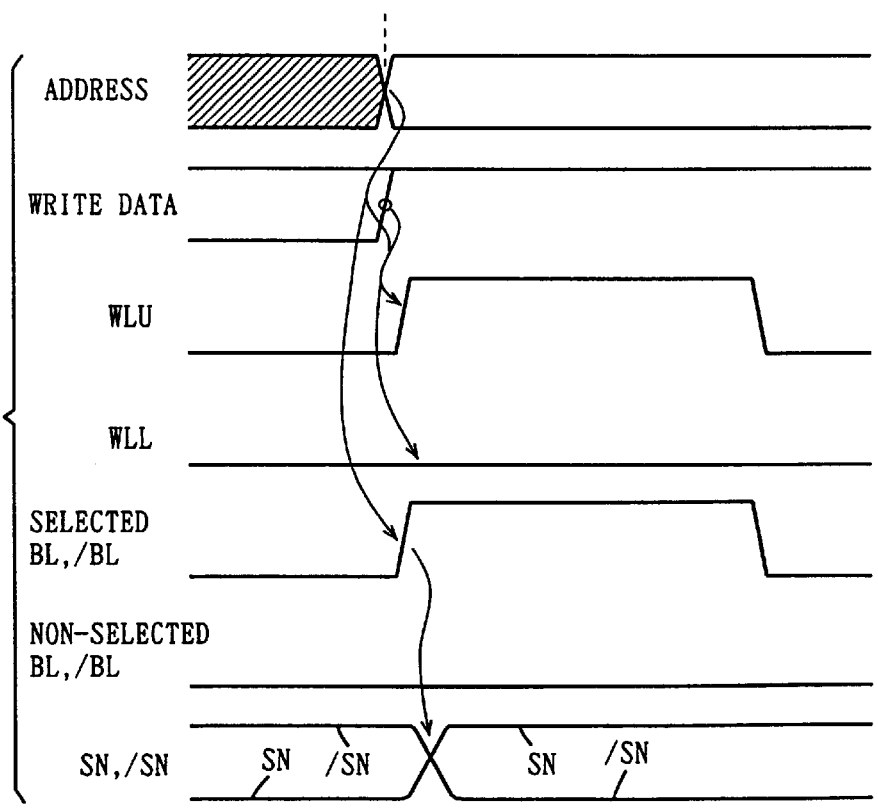
FIG. 2 is a diagram of signal waveforms showing the data writing operation sequence of the semiconductor memory device in accordance with the first embodiment of the present invention.

The memory cell further includes pnp bipolar transistors BP1 and BP2 coupled to the bit lines BL and /BL respectively, for reading data stored in the memory cell to the bit lines at the time of data reading. Bipolar transistor BP1 has its emitter connected to the bit line BL, its base connected to the other conduction node of access transistor Q3 and its collector connected to the ground node GN. Bipolar transistor BP2 has its emitter connected to the bit line /BL, its base connected to the other conduction node of access transistor Q4 and its collector connected to the ground node GN. Bipolar transistors BP1 and BP2 each have a vertical pnp structure and formed in a contact region of access transistors Q3 and Q4 and bit lines BL and /BL, and hence they each have a sufficiently small area of occupation. The operation of writing data to the memory cell will be described with reference to the diagram of signal waveforms of FIG. 2.

In the SRAM, change in an address signal is detected, and the detected change in the address is used as a trigger for an access to the memory cell. Now, assume that the potential of storage node SN is at the L level, the potential of storage node /SN is at the H level, the memory cell stores data of the L level, and data of the H level is to be written in this state.

When the change in the address signal is detected, first, word line selecting operation and bit line selecting operation are performed in accordance with the address signal. Since the write data is at the H level, the potential of the word line WLU of the selected word line pair rises to the H level, while the other word line WLL is maintained at the L level. Non-selected word line pairs are all held at the L level.

The pair of bit lines BL and /BL are precharged to the low (L) level before accessing, and as the data is written, potentials of selected bit lines BL and /BL rise to the H level. Potentials of non-selected bit line pair BL and /BL are maintained at the precharge level of L. When the potential of the word line WLU attains to the H level, access transistor Q3 is rendered conductive, and the storage node SN which is at the L level is electrically connected to the base electrode of bipolar transistor BP1. The potential of bit line BL is at the H level, bipolar transistor BP1 is rendered conductive, and collector current flows from bit line BL to bipolar transistor BP1.

In bipolar transistor BP1, PN junction between the emitter and the base is rendered conductive, and together with the collector current, a base current flows, which flows to the storage node SN. The signal potential on word line WLL is at the L level, cut transistor Q5 is non-conductive, and therefore the potentials of storage node SN rises. Finally, there is generated a base-to-emitter forward voltage drop Vbe of bipolar transistor BP1, and therefore the voltage level of storage node SN becomes lower than the voltage level of bit line BL by the emitter-to-base potential Vbe. When the voltage level of storage node SN comes close to the voltage level which is lower than the bit line BL by the emitter-to-base potential Vbe, bipolar transistor BP1 is rendered almost non-conductive, and collector current hardly flows. The ratio between the base current and the collector current is given from the current amplification factor of bipolar transistor BP1.

The signal potential on word line WLU is at the H level, cut transistor Q6 is conductive, and as the potential level of storage node SN rises, conductance of driver transistor Q2 increases, so that storage node /SN is discharged at high speed to the GND level, or the ground potential level. As the potential of storage node /SN lowers, driver transistor Q1 is rendered non-conductive. Consequently, base current of bipolar transistor BP1 is cut, the potential level of storage node SN attains to the level lower than the potential of bit line BL by the emitter-to-base potential of bipolar transistor BP1 because of the base current, and the bipolar transistor BP1 is rendered non-conductive.

Since access transistor Q4 is non-conductive, base current from bipolar transistor BP2 does not exert any influence on storage node /SN.

Though relatively large collector current flows temporarily through the bipolar transistor BP1 at the start of writing, bipolar transistor BP1 is rendered non-conductive as the potential of storage node SN rises, and the collector current is cut. Therefore, current consumption is extremely small. Further, base potential of bipolar transistor BP2 rapidly rises because of the current from the bit line /BL and is rendered non-conductive. Therefore, current consumption is extremely small.

Potential levels of non-selected bit lines BL and /BL are at the L level, bipolar transistors BP1 and BP2 are kept non-conductive, and the potential of storage node SN in the non-selected memory cell is not changed.

When the storage node SN is at the potential level of H and data of H level is to be written, bipolar transistor BP1 is maintained nearly non-conductive, and storage node SN holds the H level potential.

When the data of the L level is to be written, the potential of word line WLL attains to the H level and the potential level of word line WLU attains to the L level. In this state, the operation is the same as writing of data of the H level to the storage node /SN. By the base current of bipolar transistor BP2, the potential level of storage node /SN rises, and by the flipflop constituted by driver transistors Q1 and Q2, the potential level of storage node SN is set to the L level.

When data writing operation is completed, the voltage level of word line WL falls to the L level and voltage levels of selected bit lines BL and /BL also fall to the L level. In this state, cut transistors Q5 and Q6 are both non-conductive, and current path from storage nodes SN and /SN to the ground node GN is cut. However, resistance values of high resistance load elements R1 and R2 are extremely high and current supplied therefrom is so small as to compensate for the leak current of storage nodes SN and /SN. Therefore, the storage node holding L level data will not be charged by the high resistance load element, and therefore the voltage level does not increase.

Figure 3:
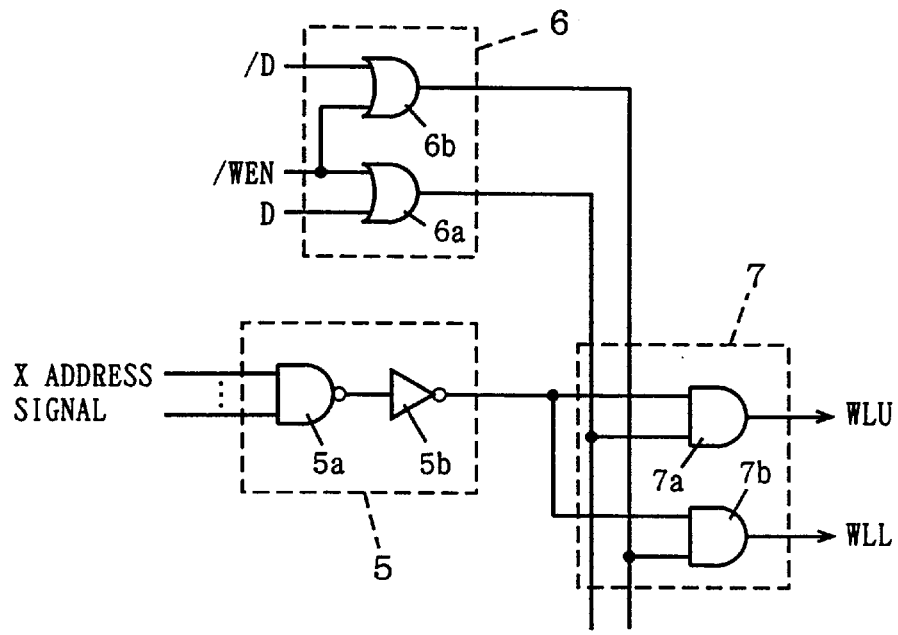
FIG. 3 shows an example of the structure of a write control portion for realizing the write sequence shown in FIG. 2.

FIG. 3 schematically shows the structure of the word line selecting portion for data writing. FIG. 3 shows a structure corresponding to a pair of word lines WLU and WLL. Referring to FIG. 3, for the pair of word lines WLU and WLL, there are provided an X decode circuit 5 for decoding an applied address signal to generate a signal for selecting a corresponding word line pair, a write control circuit 6 for generating a word line driving potential in accordance with a write enable signal /WEN and write data D, /D at the time of data writing, and a word line drive circuit 7 for driving word lines WLU and WLL to corresponding signal potentials, in accordance with the word line selection signal from X decode circuit 5 and the word line driving signal from write control circuit 6.

X decode circuit 5 includes an NAND circuit 5a for decoding a received address signal, and an inverter circuit 5b for inverting an output signal from NAND circuit 5a. When the word line corresponding to the addressed row is to be driven to the selected state, the output signal from X decode circuit 5 rises to the H level. When the corresponding word line is in the non-selected state, the output signal from X decode circuit 5 is at the L level.

Write control circuit 6 includes an OR circuit 6a receiving the write enable signal /WEN and write data D and an OR circuit 6b receiving the write enable signal /WEN and write data /D. Write data D and /D are mutually complementary data signals. Write enable signal /WEN is set to and kept at the active state of L level for a prescribed time period in accordance with an externally applied write enable signal at the time of data writing.

Word line drive circuit 7 includes an AND circuit 7a receiving the word line selection signal output from X decode circuit 5 and an output signal of OR circuit 6a of write control circuit 6, and an AND circuit 7b receiving the word line selection signal output from X decode circuit 5 and the output signal from OR circuit 6b of write control circuit 6. A signal for driving word line WLU is output from AND circuit 7a, and a signal for driving word line WLL is output from AND circuit 7b.

When write data D is at the H level, the output signal from OR circuit 6a attains to the H level, and the output signal from OR circuit 6b attains to the L level. As a result, the output signal from AND circuit 7a attains to the H level and the word line WLU is driven to the H level. Word line WLL is kept at the L level. In contrast, when data D is at the L level, the output signal from OR circuit 6b attains to the H level, and the word line driving signal transmitted from AND circuit 7b to word line WLL rises to the H level.

By utilizing the structure shown in FIG. 3, it becomes possible to drive word lines WLU and WLL corresponding to the selected row to the desired potential levels, in accordance with the write data.

Figure 4:
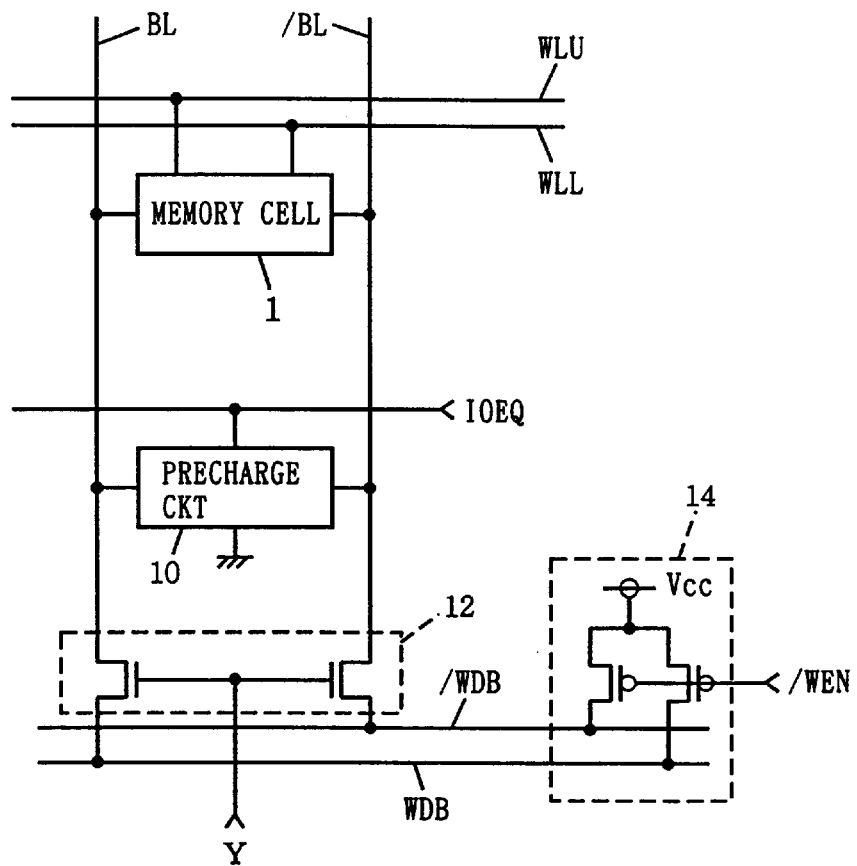
FIG. 4 schematically shows a structure of a data write portion for realizing the write sequence shown in FIG. 2.

FIG. 4 schematically shows an example of the structure of the data write portion. Referring to FIG. 4, for bit lines BL and /BL, there are provided a precharge circuit 10 for precharging bit lines BL and /BL to a prescribed potential level of low (L) when an equalize instructing signal IOEQ is activated, and a column selection gate 12 responsive to a column selection signal Y from a column decoder, not shown, for connecting bit lines BL and /BL to write data bus lines WDB and /WDB. Precharge instructing signal IOEQ is activated in the standby state (at the completion of data writing/reading or before data writing/reading).

For write data bus lines WDB and /WDB, a write drive circuit 14 responsive to write enable signal IWEN for transmitting power supply voltage Vcc to the write data bus lines WDB and /WDB is provided. FIG. 4 shows an example in which write drive circuit 14 includes p channel MOS transistors provided corresponding to write data bus lines WDB and /WDB respectively, receiving at their gates the write enable signal /WEN.

Before data writing, bit lines BL and /BL are precharged to the L level by precharge circuit 10. At the time of writing, the column selection signal Y is activated in accordance with an external address signal, column selection gate 12 is rendered conductive, and bit lines BL and /BL are connected to write data bus lines WDB and /WDB. At the time of data writing, the write enable signal /WEN is set to the active state of L level for a prescribed time period. Accordingly, by write drive circuit 14, write data bus lines WDB and /WDB are driven to the H level, and in response, voltage levels of selected bit line pair BL and /BL attain to the H level. Consequently, it is possible to drive selected pair of bit lines BL and /BL which has been precharged to the L level both to the H level at the time of data writing and to hold non-selected bit line pairs BL and /BL at the L level potential.

Figure 5:
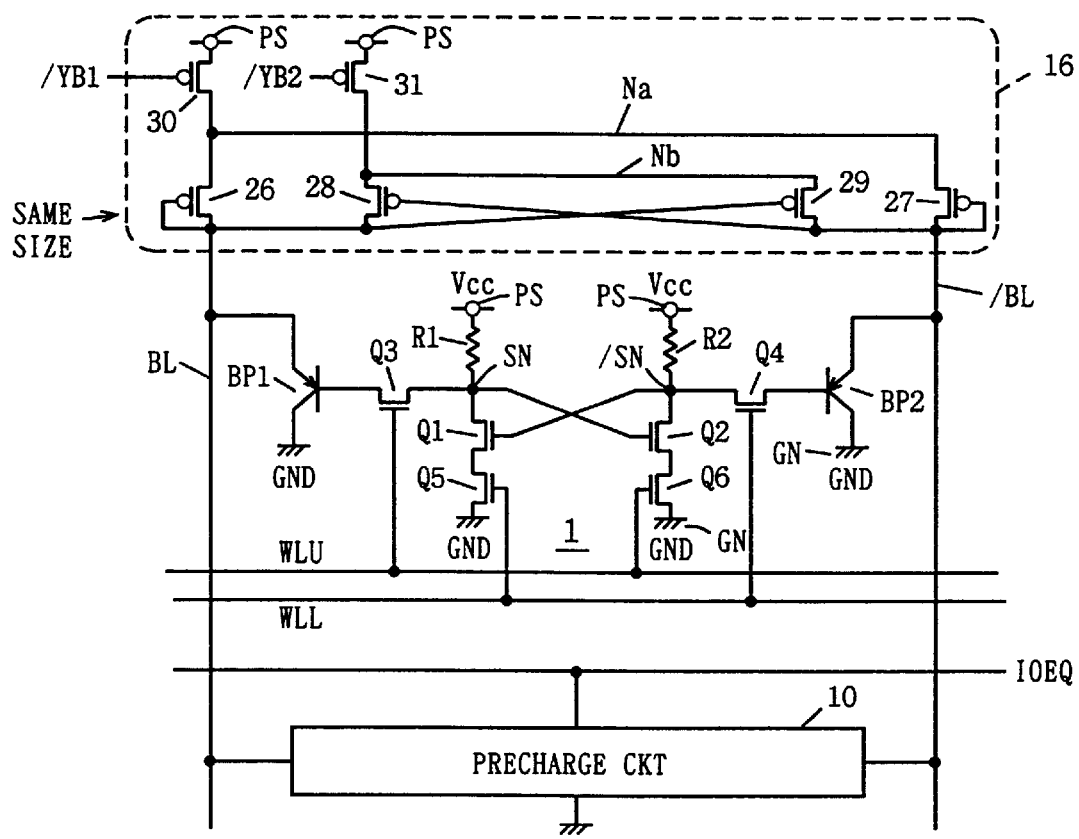
FIG. 5 shows a structure of a read load circuit of the semiconductor memory device in accordance with the first embodiment of the present invention.

FIG. 5 shows a structure of a main portion of the SRAM in accordance with the first embodiment of the present invention. FIG. 5 shows the structure of the data reading portion of 1 bit of memory cell. Memory cell 1 has the same structure as shown in FIG. 1, and corresponding portions are denoted by the same reference characters. Detailed description thereof is not repeated.

For bit lines BL and /BL, a precharge circuit 10 for precharging bit lines BL and /BL to the low level or the low voltage level, and a read load circuit 16 for reading, amplifying and latching memory cell data on bit lines BL and /BL at the time of data reading are provided. Read load circuit 16 includes a diode connected p channel MOS transistor 26 connected between node Na and bit line BL, a p channel MOS transistor 27 connected between node Na and bit line /BL, and cross coupled p channel MOS transistors 28 and 29 for differentially amplifying potentials of bit lines BL and /BL. The p channel MOS transistor 28 has one conduction node (source) connected to a node Nb, the other conduction node connected to bit line BL and its gate connected to bit line /BL. The p channel MOS transistor 29 has one conduction node (source) connected to node Nb, gate connected to bit line BL and the other conduction node connected to bit line /BL.

Figure 6:
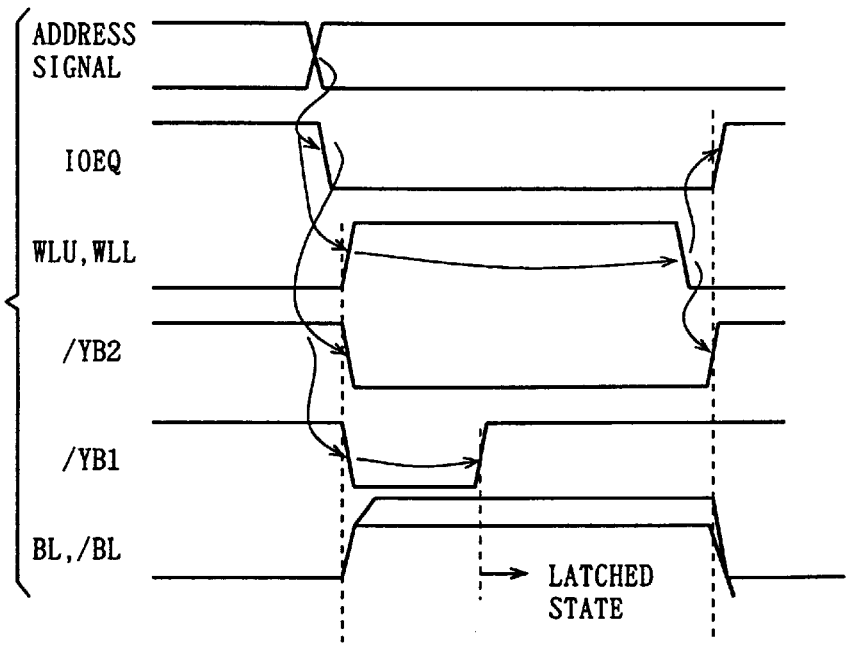
FIG. 6 is a diagram of signal waveforms representing the operation of the read load circuit shown in FIG. 5.

Read load circuit 16 further includes a switching transistor 30 consisting of a p channel MOS transistor which is rendered conductive when read enable signal /YB1 is activated (L level), for electrically connecting node Na to power supply node PS and a switching transistor 31 consisting of a p channel MOS transistor which is rendered conductive when a second read enable signal /YB2 is activated, for electrically connecting node Nb to power supply node PS. MOS transistors 26, 27, 28 and 29 are of the same size (ratio of gate width to gate length: current drivability). Operation for reading data from the memory cell shown in FIG. 5 will be described with reference to the diagram of signal waveforms of FIG. 6.

Assume that data of H level is held in storage node SN. When an address signal changes, equalize instructing signal IOEQ is inactivated as the change in the address is detected, and precharge circuit 10 is inactivated. Consequently, precharging of bit lines BL and /BL to the L level is completed. When precharging is completed, word line and bit line selecting operations are performed in accordance with the applied address signal, potentials of word lines WLL and WLU provided for the selected row rise to the H level, access transistors Q3 and Q4 are both rendered conductive, cut transistors Q5 and Q6 are also rendered conductive, and storage nodes SN and /SN stably hold data of H and L levels.

Parallel to the word line selecting operation, read enable signals /YB1 and /YB2 which have been inactive are driven to the active state of L level. Consequently, switching transistors 30 and 31 are rendered conductive, and nodes Na and Nb are coupled to power supply node PS. Bit lines BL and /BL are at the L level, diode connected p channel MOS transistors 26 and 27 are rendered conductive, supplying current to bit lines BL and /BL, and therefore voltage levels thereof are increased. Further, p channel MOS transistors 28 and 29 supply current to bit lines BL and /BL in accordance with the potentials of bit lines BL and /BL.

It is assumed that MOS transistors 26 to 29 have the same size and hence the same current drivability. Therefore, potentials of bit lines BL and /BL can surely be increased, so that it becomes possible to prevent the cross coupled p channel MOS transistors 28 and 29 from immediately entering latch state by differential amplification. Therefore, in the initial state of reading, influence of imbalanced potentials of bit lines BL and /BL (resulting from imbalanced transistor characteristics in precharge circuit 10, imbalanced bit line capacitance and so on), offset of the starting point of operation resulting from variation in threshold voltages of transistors in read load circuit 16 can be avoided, and therefore erroneous reading of data can be prevented. Further, erroneous reading of data resulting from current offset of bit lines BL and /BL at the initial state of reading, derived from variation in transistor parameters can be prevented.

When potentials of bit lines BL and /BL become higher than the emitter-to-base voltage of bipolar transistors BP1 and BP2, one of bipolar transistors BP1 and BP2 is rendered conductive. Storage node SN is storing data of H level. Therefore, collector current hardly flows in bipolar transistor BP1, so that bit line BL is charged by the diode connected p channel MOS transistor 26 and cross coupled p channel MOS transistor 28, so that its potential increases. As the potential of the bit line BL increases, the amount of current supplied by MOS transistors 26 and 28 is reduced at a certain bit line potential.

Meanwhile, storage node /SN stores data of L level. When the potential of bit line /BL becomes higher than the emitter-to-base potential of bipolar transistor BP2, bipolar transistor BP2 is rendered conductive, and by the collector current flowing through bipolar transistor BP2, increase in potential of bit line /BL is suppressed. Base current of bipolar transistor BP2 is discharged by MOS transistors Q2 and Q6, and therefore increase in potential of storage node /SN is suppressed.

Consequently, there is generated a potential difference between bit lines BL and /BL. After the potential difference between the bit lines becomes sufficiently large (after the lapse of a prescribed time period of 1 ns to 50 ns), read enable signal /YB1 is driven to the inactive state of H level, and switching transistor 30 is rendered non-conductive. Diode connected p channel MOS transistors 26 and 27 stop charging operation, and by the cross coupled p channel MOS transistors 28 and 29, current is supplied to bit lines BL and /BL. MOS transistors 28 and 29 have their sources coupled to node Nb, and by MOS transistors 28 and 29, potentials of bit lines BL and /BL are latched. More specifically, when read enable signal /YB1 is inactivated and the potential of bit line BL attains to the H level of a prescribed potential, MOS transistor 29 is rendered almost non-conductive, and it does not supply current to bit line /BL. Therefore the potential of bit line /BL is almost constant (bipolar transistor BP2 is conductive and MOS transistor 27 is nonconductive), supply of current of MOS transistor 28 is driven in accordance with the potential of bit line /BL, and the potential of bit line BL is maintained. Meanwhile, bit line /BL is held at a voltage level of about the emitter-to-base forward voltage drop of bipolar transistor BP2. Therefore, by MOS transistors 28 and 29, potentials of bit lines BL and /BL are latched.

By reading the potential difference between bit lines BL and /BL through a read gate, not shown, data is read.

After a prescribed time period, potentials of word lines WLU and WLL fall to the L level, data reading is completed and after the word lines WLU and WLL are rendered inactive, equalize instructing signal IOEQ attains to the active state of H level and read enable signal /YB2 attains to the inactive state of H level. Consequently, potentials of bit lines BL and /BL through which memory cell data has been read are again precharged to the L level. Stability of holding memory cell data when the memory cell is selected will be described in the following.

Figure 7:
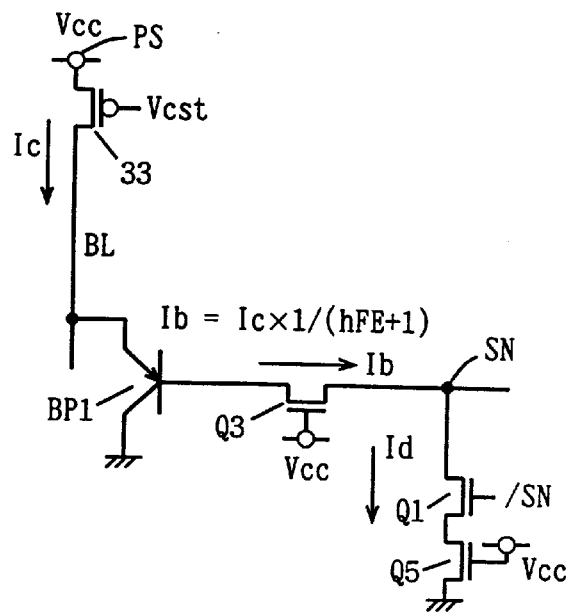
FIG. 7 is an illustration related to stability of data retention by the inverter latch of the memory cell and the read load circuit shown in FIG. 5.

As shown in FIG. 7, assume that a constant current source 33 is connected as the read load circuit to bit line BL, for simplicity of description. Constant current source 33 is formed of a p channel MOS transistor connected between power supply node PS and bit line BL and receiving at its gate a constant voltage Vcst. Constant current source 33 supplies bit line current Ic. Assume that the word line is selected with the storage node SN storing data of L level. In this state, access transistor Q3 receiving at its gate the power supply voltage Vcc is rendered conductive, cut transistor Q5 is rendered conductive in accordance with the signal of the word line, and it serves as a current source. Driver transistor Q1 has its gate connected to storage node /SN storing data of H level. When base current Ib of bipolar transistor BP1 and drain current Id flowing through driver transistor Q1 satisfy the following relation, data destruction at storage node SN can be prevented.

$$\beta = Id / Ib$$

$$= Id / (Ic \cdot 1 / (hFE + 1)) \geq 3$$

wherein hFE represents current amplification factor of pnp bipolar transistor BP1 (or BP2).

When Vcc=1.8V, Ic=100 $\mu$A and hFE=10, the following expression is obtained.

$$Id/(100 \ \mu A \cdot 1/(10+1)) \geq 3$$

that is, $$Id \geq 100 \ \mu A \cdot (1/11) \cdot 3 \geq 27 \ \mu A$$

More specifically, even under the condition that power supply voltage Vcc is 1.8V, sufficiently large static noise margin SNM can be obtained and the data of the memory cell can be stably held provided that driver transistor Q1 has sufficient current drivability for supplying drain current Id of 27 $\mu$A.

Figure 8:
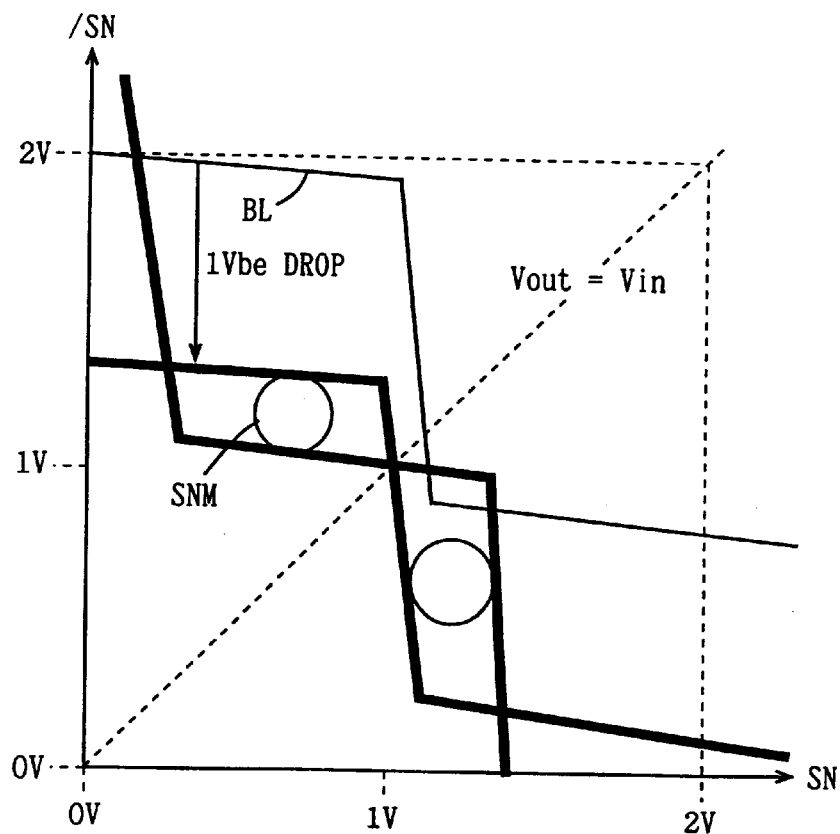
FIG. 8 is a graph showing data retention characteristic of the memory cell in the structure shown in FIG. 7.

At the time of data reading, referring to FIG. 8, H level data in storage node SN has a voltage level lower than the H level of the bit line BL by the emitter-to-base voltage Vbe of bipolar transistor BP1 (or BP2). When the word line is selected and base current Ib is discharged as drain current Id by driver transistor Q1, the change at the transition portion of input/output transfer characteristic becomes steep, ensuring stable data retention. Therefore, data can be held stably even when the power supply voltage is low, and hence a highly reliable SRAM is realized.

Figure 9:
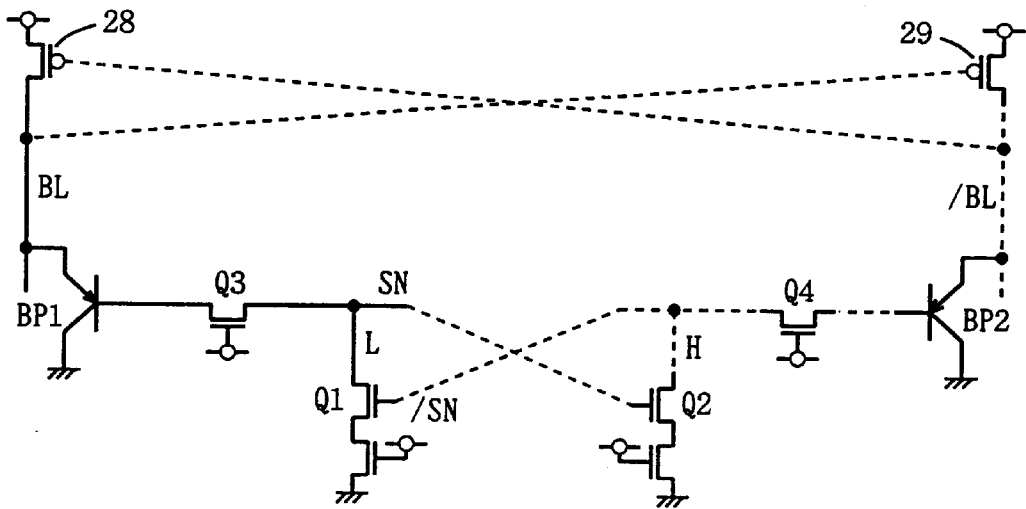
FIG. 9 shows connection between a memory cell and bit line at the time of data reading in accordance with the first embodiment of the present invention.

FIG. 9 schematically shows the read load circuit. At the time of data reading, p channel MOS transistors 28 and 29 having cross coupled gates and drains are connected to bit lines BL and /BL, respectively. When potentials of bit lines BL and /BL are increased by MOS transistors 28 and 29, bipolar transistor BP1 is rendered conductive. When storage node /SN is at the H level, bipolar transistor BP2 is non-conductive (base potential is higher than the potential of bit line /BL). Therefore, when the potential of bit line /BL increases, the increase in potential of bit line /BL is transferred to the gate of MOS transistor 28, the amount of current supplied by MOS transistor 28 is reduced, and therefore collector current flowing from bit line BL through bipolar transistor BP1 is reduced.

Figure 10:
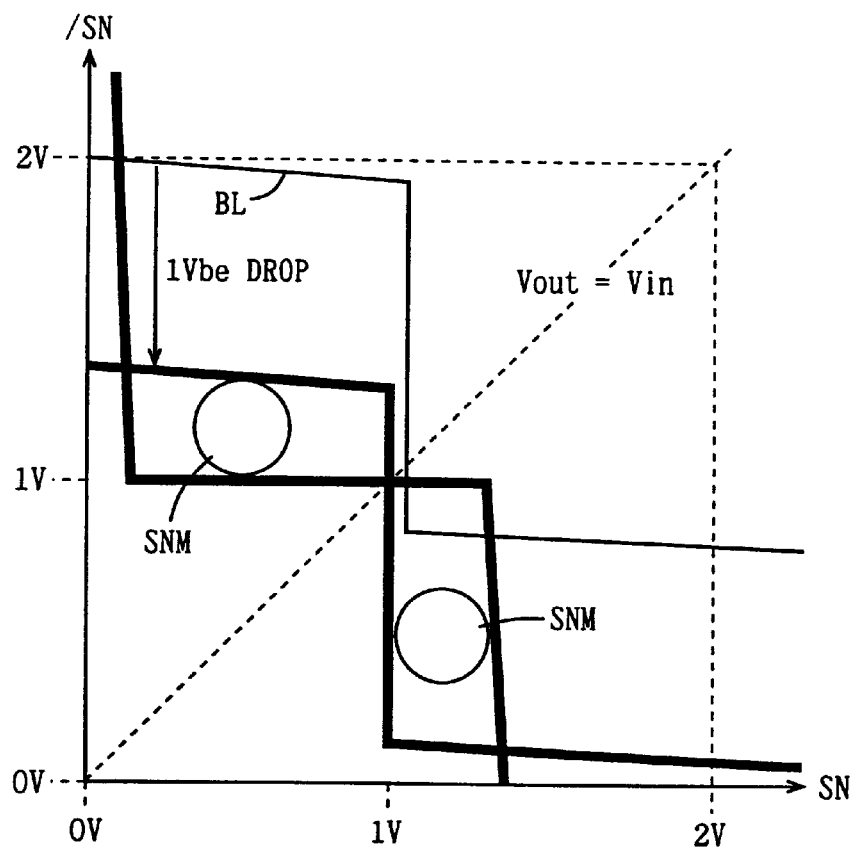
FIG. 10 is a graph showing data retention characteristic of the memory cell in the arrangement of FIG. 9.

As the potential of bit line /BL increases, the amount of current supply of bit line BL becomes smaller, and therefore the base current flowing through bipolar transistor BP1 is reduced. Therefore, the ratio of base current flowing through access transistor Q3 to the drain current flowing through driver transistor Q1 is made smaller, the input/output transfer characteristics of the inverter constituted by the cross coupled MOS transistors Q1 and Q2 would be steeper as shown in FIG. 10 and the static noise margin SNM becomes larger. Therefore, data can be held more stably.

As the potential of bit line /BL increases, MOS transistor 28 is rendered non-conductive, and stops current supply to bit line BL. Accordingly, collector current of bipolar transistor BP1 is cut and base current Ib is also cut. Therefore, floating of L level potential of storage node SN can be prevented, ensuring holding of data at the L level.

Bit lines BL and /BL are charged by using diode elements and cross coupled MOS transistors and when one of the bipolar transistors BP1 and BP2 is rendered conductive, potential difference is generated between the bit lines in accordance with the stored data. After the generation of potential difference, the diode element is rendered non-conductive, and only the cross coupled transistors are kept in the operative state. Therefore, when the cross coupled MOS transistors are in the latching state, current hardly flows to the cross coupled MOS transistors (in the latching state, the MOS transistor connected to the bit line of H level is rendered non-conductive as the drain/source voltages become approximately equal to each other, and the MOS transistor connected to the bit line of L level is rendered non-conductive as its gate potential attains to the H level), and therefore current consumption can be significantly reduced as compared with the structure in which current source is constantly connected to the bit line to cause column current.

At the start of data reading, the diode connected MOS transistors and the cross coupled MOS transistors are all set to the operative state. Since these transistors have the same size, the potentials of bit lines BL and /BL rise until one of the bipolar transistors BP1 and BP2 is rendered conductive, and thereafter the potential of the bit lines changes in accordance with the stored data. At this time, since the diode connected MOS transistors are rendered conductive, it becomes possible to prevent the cross coupled MOS transistor from entering the latching state. Therefore, it is possible to generate potential difference precisely in accordance with the stored data without any influence of imbalance in bit line capacitance and in bit line precharge potential.

Further, the read load circuit supplies collector current of bipolar transistors BP1 and BP2, and stability in holding data of the memory cell is determined by the ratio of base current of bipolar transistors BP1 and BP2 to the drain current caused by the driver transistor. Therefore, the size of the MOS transistors included in the read load circuit may be enlarged, the size of the MOS transistor included in the read load circuit may be set with relatively large margin (provided that it has sufficient current drivability to charge bit lines at high speed, where the driving current is also the collector current which can be set with a margin), and therefore design is facilitated.

Figure 11:
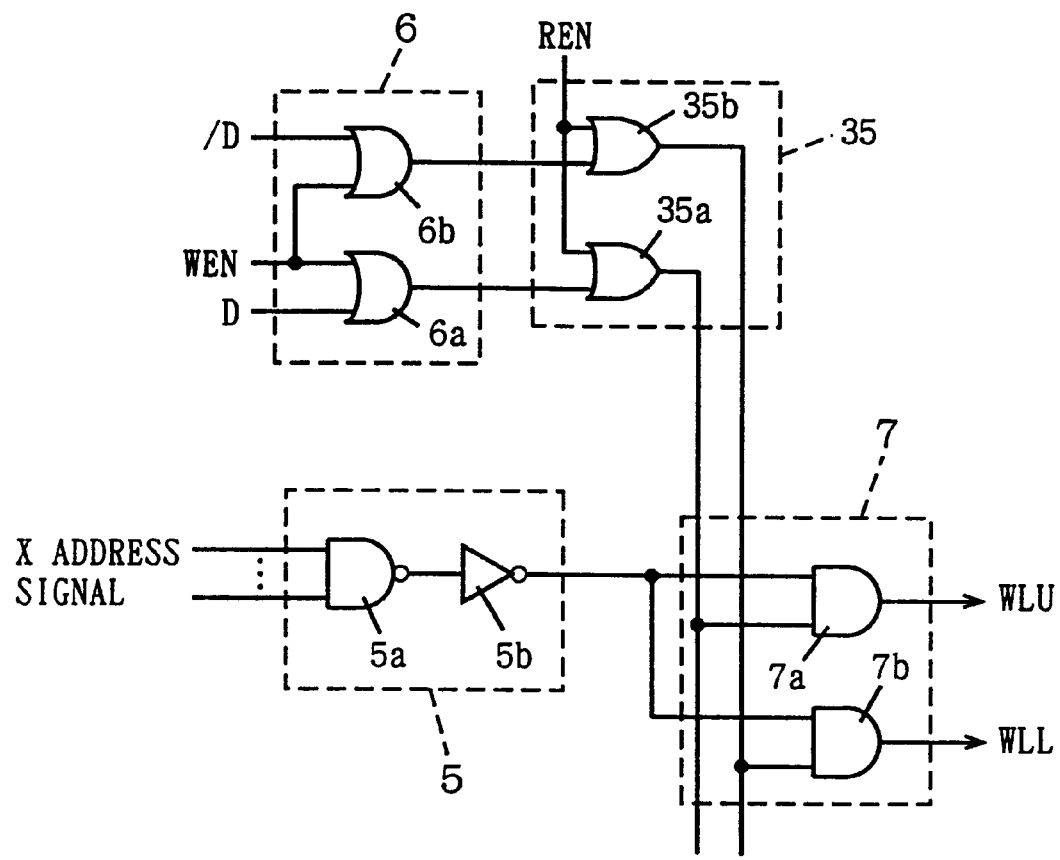
FIG. 11 schematically shows the structure of a write/read control portion for realizing the read sequence shown in FIG. 6.

FIG. 11 schematically shows a structure of the word line driving portion. FIG. 11 schematically shows the structure of the word line driving portion provided for a pair of word lines WLU and WLL. The structure of the word line driving portion shown in FIG. 11 differs from that of FIG. 3 in the following points. Namely, a read word line control circuit 35 which activates an output signal from write control circuit 6 when read enable signal REN is activated (H level) is provided. Read word line control circuit 35 includes an OR circuit 35a receiving an output signal from OR circuit 6a of write control circuit 6 and read enable signal REN, and an OR circuit 35b receiving an output signal from OR circuit 6b of write control circuit 6 and read enable signal REN. A word line driving signal is output from OR circuits 35a and 35b and applied to word line drive circuit 7.

Read enable signal REN is set to and kept for a prescribed time period at the active state of H level in accordance with the address transition detection signal at the time of data reading. Therefore, a signal which is kept at the H level for a prescribed time period is output from read word line control circuit 35, and when the word line provided corresponding to the selected row is selected by X decode circuit 5, paired word lines WLU and WLL corresponding to the selected row are both driven to the selected state of H level.

Figure 12:
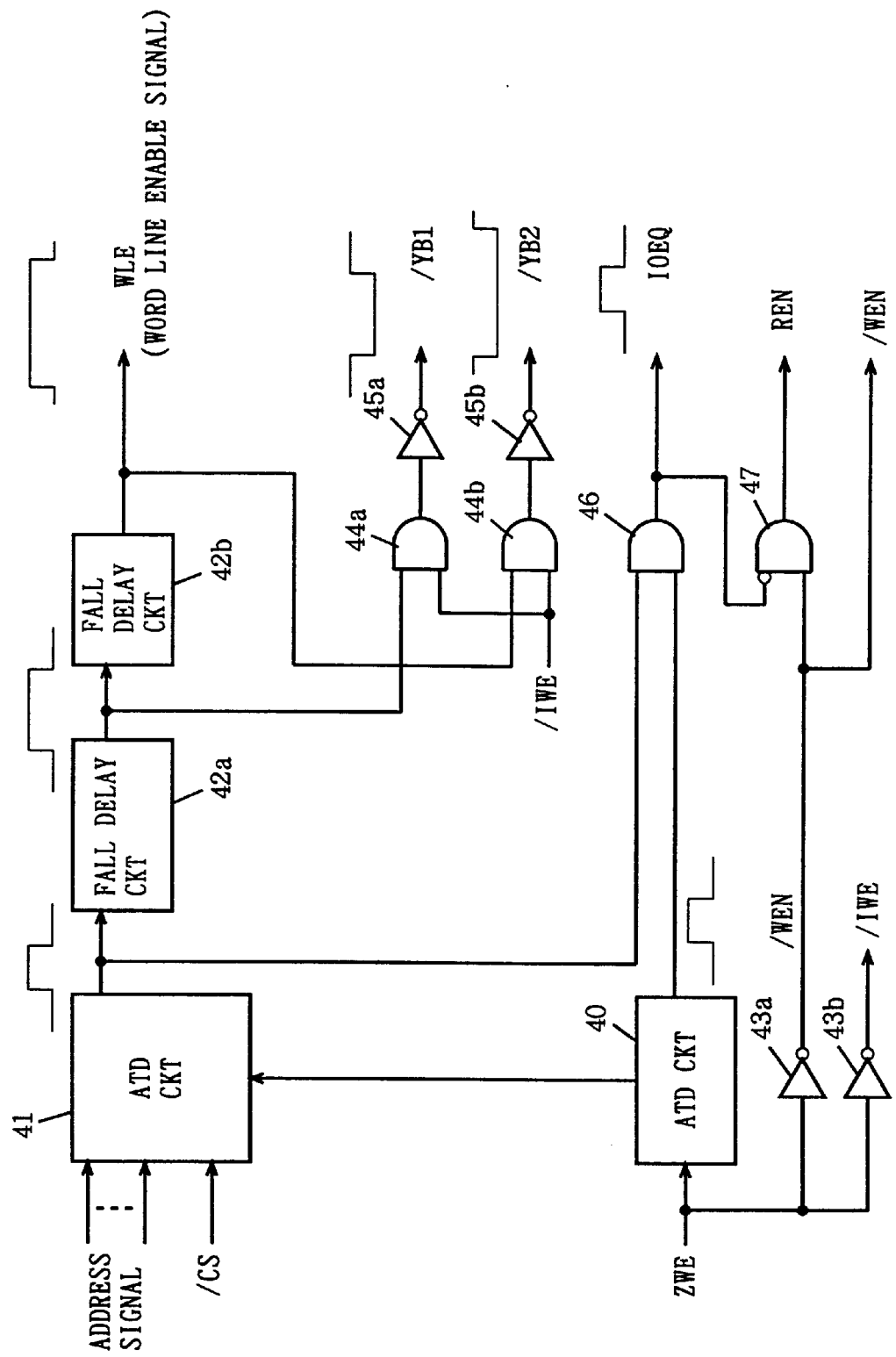
FIG. 12 schematically shows an example of the structure of a control signal generating portion for realizing the data read sequence shown in FIG. 6.

FIG. 12 schematically shows the structure of the portion generating the control signals, shown in FIG. 5. Referring to FIG. 12, the control signal generating circuit includes a signal transition detection (ATD) circuit 40 for detecting transition in an external write designating signal ZWE (H active) and generating a one shot pulse signal, an ATD circuit 41 receiving a chip select signal /CS and the address signal, for detecting point of transition of the address signal when the chip select signal /CS is activated and at L level for generating a one shot pulse signal, and two stages of cascaded fall delay circuits 42a and 42b for delaying rise of the pulse signal from ATD circuit 41.

ATD circuit 41 provides, as an output, a logical sum (OR) of the one shot pulse signal from ATD circuit 40 and the one shot pulse signal generated at the point of transition of the address signal. By the fall delay circuits 42a and 42b, the pulse width of the one shot pulse signal from ATD circuit 41 is made wider, thus producing a word line enabling signal WLE having a prescribed time width. This signal WLE is applied to the row decoder and the like, determining the time period in which the word line is kept at the selected state, and other control signals are defined referring to the word line enabling signal WLE. The one shot pulse signal from ATD circuit 40 is applied to ATD circuit 41, since at the time of data writing and reading to the same address position, word line enable signal WLE is kept active for a prescribed time period only, which means that it is necessary to activate word line for writing and reading separately.

The control signal generating circuit further includes inverters 43a and 43b provided parallel to each other and receiving write designating signal ZWE, an AND circuit 44a receiving an internal write designating signal /IWE from inverter 43b and an output signal from fall delay circuit 42a, an AND circuit 44b receiving internal write designating signal /IWE from inverter 43b and an output signal from fall delay circuit 42b, an inverter 45a for inverting an output signal from AND circuit 44a and outputting a read load enabling signal /YB1, an inverter 45b inverting an output signal from AND circuit 44b and outputting read load enabling signal /YB2, an AND circuit 46 receiving output signal from ATD circuits 40 and 41 for outputting IO equalize instructing signal IOEQ, and a gate circuit 47 receiving write enable signal /WEN from inverter 43a and equalize instructing signal IOEQ.

When IO equalize instructing signal IOEQ attains to the L level, write enable signal /WEN is at the inactive state of H level indicating data reading, gate circuit 47 drives read enables signal REN to the active state of H level.

In the control signal generating circuit shown in FIG. 12, IO equalize instructing signal IOEQ is generated by logical product of pulse signals output from ATD circuits 40 and 41. Therefore, when write designating signal ZWE (which corresponds to an inverted version of an external write enable signal /WE) changes, address signal changes and chip select signal /CS changes to the active state, the signal IOEQ is driven to the active state of H level for a prescribed time period. IO equalize instructing signal IOEQ is also driven to an active state in an inactive period in which neither writing nor reading is performed, by the path not shown (for example, when chip select signal /CS is at the inactive state of H level and the semiconductor memory device is in non-selected state, IO equalize instructing signal IOEQ is driven to the active state of H level).

Read load enabling signal /YB1 is driven to the active state of L level in synchronization with the rise of the output signal from fall delay circuit 42a when internal write designating signal /IWE is at the H level indicating data reading. The active period of the read load enabling signal /YB1 is determined by the delay time of fall delay circuit 42a and it is shorter than the active period of word line enabling signal WLE. Fall delay circuits 42a and 42b do not provide any delay for rising. Therefore, read load enabling signal /YB1 is driven to the active state approximately at the same time as activation of word line enabling signal WLE.

Read load enabling signal /YB2 is activated in response to the output signal of fall delay circuit 42b, that is, in response to activation of word line enabling signal WLE when internal write designating signal /IWE is inactive (indicating data reading). Therefore, the read load activating signal /YB2 is driven to the active state approximately at the same time as activation of word line enabling signal WLE, and the active period is almost the same as the active period of the word line activating signal WLE.

Read enable signal REN is activated to instruct data reading when IO equalize instructing signal IOEQ is set to the inactive state of L level and write enable signal IWEN is at the H level after completion of equalizing.

As described above, according to the first embodiment of the present invention, for the memory cell having cross coupled type flipflop connected to the bit lines through bipolar transistors, the bit line potentials are amplified by using diode elements and cross coupled transistor elements. Therefore, what is required for the driver transistor of the memory cell is simply the drivability for fully discharging the base current of the bipolar transistor. Therefore, static noise margin thereof can be enlarged, and memory cell data can be stably held even in operation with low power supply voltage.

Further, current is supplied to the bit lines by a read load circuit using diode elements and cross coupled transistors and therefore bit line potentials can be amplified and latched at a high speed, enabling high speed data reading. Further, by the cross coupled transistors, the bit line potentials are fed back to control gate potential of the cross coupled transistors. Current in the read load circuit is consumed only at the start of data reading, and therefore current consumption can be reduced.

Further, transistors of the read load circuit are adapted to have the same size, and after charging the bit lines, the bit line potentials are differentially amplified and latched. Therefore, bit line potentials can be surely amplified and latched without any influence of imbalance in bit line capacitances and imbalance in bit line potentials, whereby accurate data reading is possible.

Further, current is supplied through the read load circuit to the bit lines, and what is required for the driver transistor of the memory cell is simply to fully discharge the base current of the bipolar transistor. What is required for the transistor element of the read load circuit is simply to supply current of necessary magnitude, and the limitations in size is not strict. Therefore, it can be designed with sufficient tolerance and memory cell data can be accurately read without any influence of the size of the read load circuit transistor derived from mask misalignment during manufacturing, for example.

[Second Embodiment]

Figure 13:
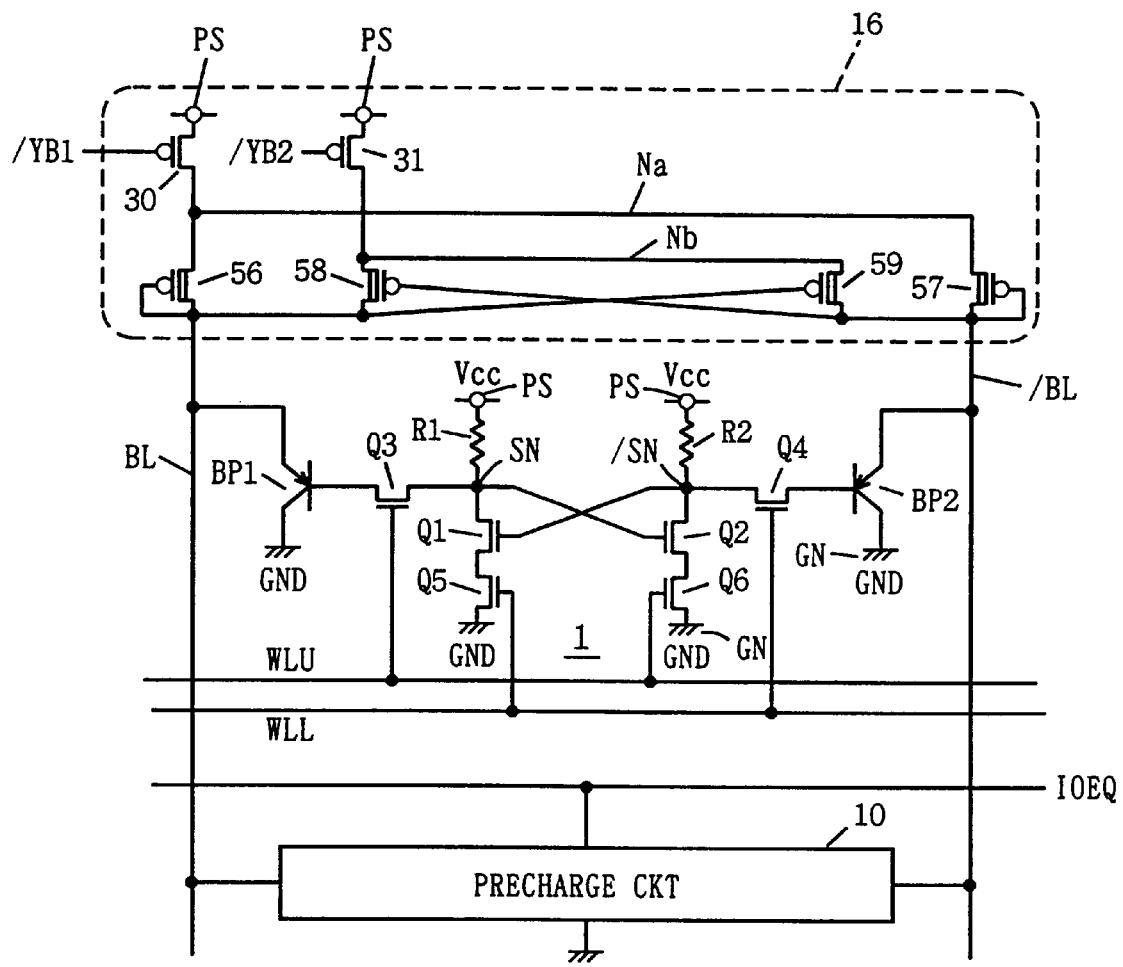
FIG. 13 schematically shows a main structure of a semiconductor memory device in accordance with a second embodiment of the present invention.

FIG. 13 schematically shows the structure of a main portion of the SRAM in accordance with the second embodiment of the present invention. The structure shown in FIG. 13 differs from the structure of FIG. 5 in the following point. Namely, the absolute values of threshold voltages of diode connected p channel MOS transistors 56 and 57 and cross coupled p channel MOS transistors 58 and 59 included in read load circuit 18 are made smaller than the absolute values of threshold voltages of other transistors, namely, driver transistors Q1 and Q2, access transistors Q3 and Q4 and cut transistors Q5 and Q6 of memory cell 1, for example. Except for this point, the structure is the same as that of FIG. 5. Corresponding portions are denoted by the same reference characters and detailed description thereof is not repeated.

Figure 14:
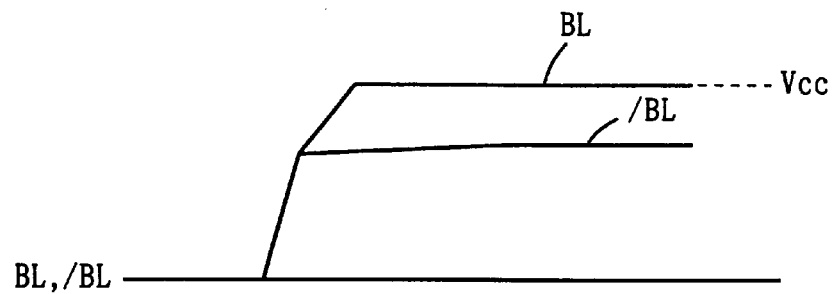
FIG. 14 is an illustration related to operational characteristics of the read load circuit shown in FIG. 13.

When read load circuit 16 shown in FIG. 13 is used, signal waveforms at the time of data reading on bit lines BL and /BL are as shown in FIG. 14. At the initial state of data reading, bit lines BL and /BL are pulled up by MOS transistors 56 to 59. When the bipolar transistor is rendered conductive and a large collector current flows, increase in potential of the corresponding bit line becomes moderate. When the bipolar transistor does not operate, that is, when storage node SN stores data of H level, the potential of bit line BL rises relatively at high speed. In this case, as the potential of bit line /BL rises, current drivability of MOS transistor 58 decreases, and as the potential of bit line BL increases, current supplying capability of MOS transistors 56 and 58 decreases.

When the potential of bit line BL attains Vcc-Vthp, the diode connected MOS transistor 56 is rendered nonconductive. Here, Vthp represents the absolute value of the threshold voltage of MOS transistors 56 to 59. At this time, the potential of bit line /BL is lower because of the collector current of bipolar transistor BP2. Therefore, MOS transistor 58 is rendered conductive, increasing potential of bit line BL finally to the level of the power supply voltage Vcc. MOS transistor 59 is rendered non-conductive when MOS transistor 56 is rendered non-conductive.

Therefore, the voltage level eventually attainable by the bit line /BL is the voltage level of +Vbe. If the absolute value Vthp of the threshold voltage is small, operation region of the diode connected p channel MOS transistor becomes wide, and therefore power supply voltage Vcc can be made lower. Therefore, by making smaller the absolute value of the threshold voltage of MOS transistors 56 to 59 included in read load circuit 16, the operational power supply voltage Vcc can be set lower, enabling operation under low power supply voltage and reduction in current consumption. Further, high speed operation becomes possible (as signal amplitude becomes smaller). Further, same effect as in the first embodiment can be provided.

[Third Embodiment]

Figure 15:
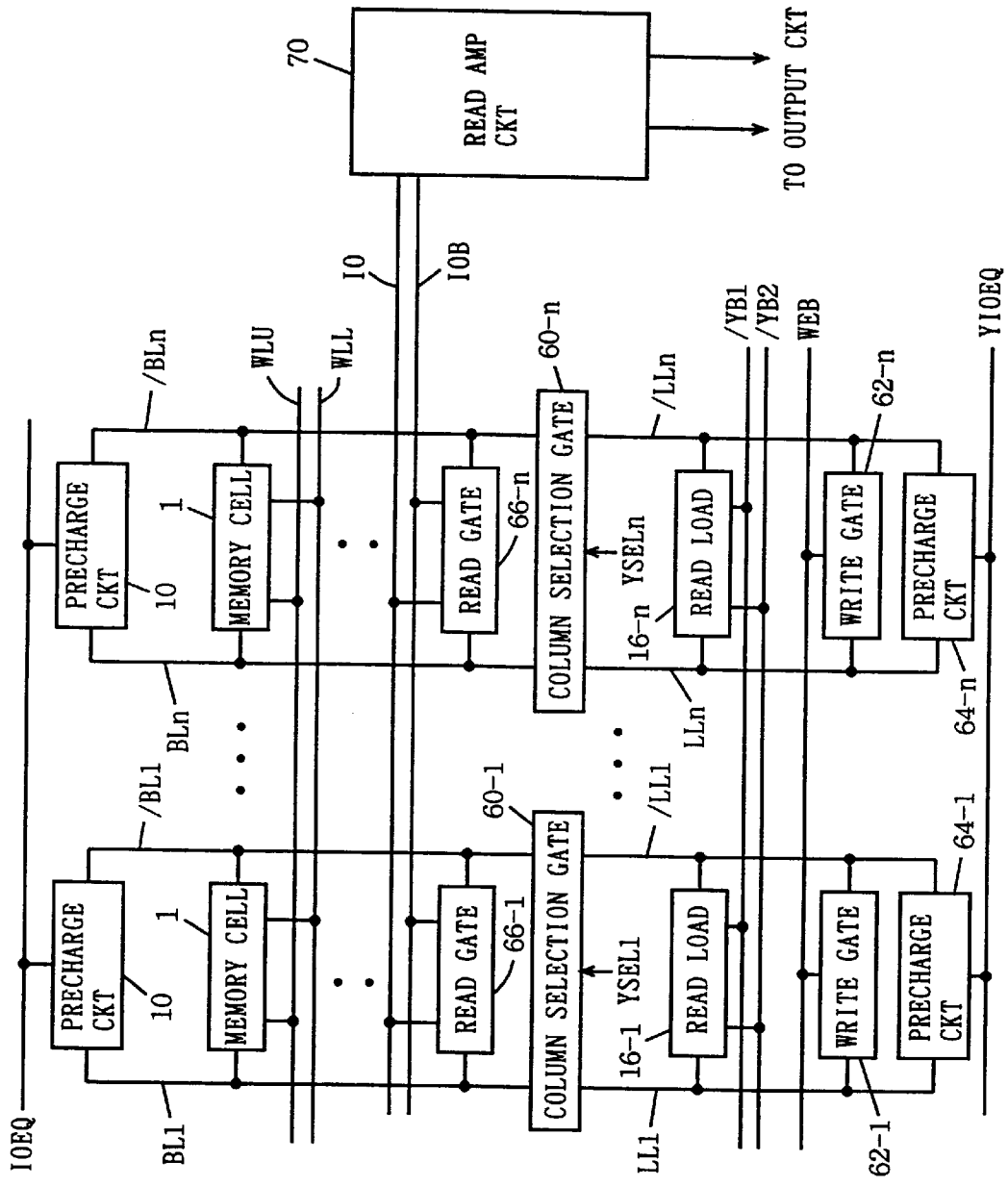
FIG. 15 schematically shows a main structure of a semiconductor memory device in accordance with a third embodiment of the present invention.

FIG. 15 schematically shows the structure of a main portion of the SRAM in accordance with the third embodiment of the present invention.

FIG. 15 shows a structure for memory cells 1 arranged in one row and n columns. Word lines WLU and WLL are arranged for one row of memory cells. Memory cell 1 has the same structure as the memory cell of the first and second embodiments described above. To each of n pairs of bit lines BL1, /BL1 to BLn, /BLn, a column of memory cells are connected. To each of the bit lines BL1, /BL1 to BLn, /BLn, a precharge circuit 10 is provided for precharging corresponding bit lines BL1, /BL1 to BLn, /BLn to the L level in response to activation of equalize instructing signal IOEQ. The structure of precharge circuit 10 is also the same as that of the first and second embodiments.

Corresponding to bit lines BL1, /BL1 to BLn, /BLn, load buses LL1, /LL1 to LLn, /LLn are provided, respectively. Between the pairs of bit lines BL1, /BL1 to BLn, BL1n and corresponding pairs of load buses LL1, /LL1 to LLn, /LLn, column selection gates 60-1 to 60-n are provided which are rendered conductive in response to column selection signals YSEL1 to YSELn from a column decoder, not shown. Only the column selection gate which corresponds to the column selected by the column selection signal is rendered conductive, so that bit lines BL and /BL are electrically connected to load bus LL and /LL.

Corresponding to load buses LL1, /LL1 to LLn, /LLn, read load circuits 16-1 to 16-n are provided, respectively. The structure of read load circuits 16-1 to 16-n is the same as that of the first or second embodiment above.

For the load buses LL1, /LL1 to LLn, LLn, write gates 62-1 to 62-n which are rendered conductive when write enable signal WEB (equivalent to WEN) is activated for precharging load buses LL1, /LL1 to LLn, /LLn to the H level, and precharge circuits 64-1 to 64-n responsive to the equalize instructing signal YIOEQ for precharging load bus lines LL1, /LL1 to LLn, /LLn to the L level, are provided.

For bit line pairs BL1, /BL1 to BLn, /BLn, read gates 66-1 to 66-n are provided for differentially amplifying potential of the corresponding bit line pair for transmission to common data bus lines IO and IOB. The potentials on common read data bus IO and IOB are amplified by a read amplification circuit 70 which is activated at the time of data reading, and then applied to an output circuit.

By separating bit lines BL1, /BL1 to BLn, /BLn from read load buses LL1, /LL1 to LLn, /LLn by means of column selection gates 60-1 to 60-n, it becomes possible to use control signals commonly for read load circuits 16-1 to 16-n, write gates 62-1 to 62-n and precharge circuits 64-1 to 64-n, respectively. When read load circuit is to be activated in a unit of bit line pair, it is necessary to combine the column selection signal with the control signal for each pair of bit lines, which makes interconnection difficult. However, by the structure shown in FIG. 15, the control signal for data reading and writing can be commonly used by respective bit line pairs, and therefore the area occupied by interconnection lines is reduced and layout of interconnection lines is facilitated.

Figure 16:
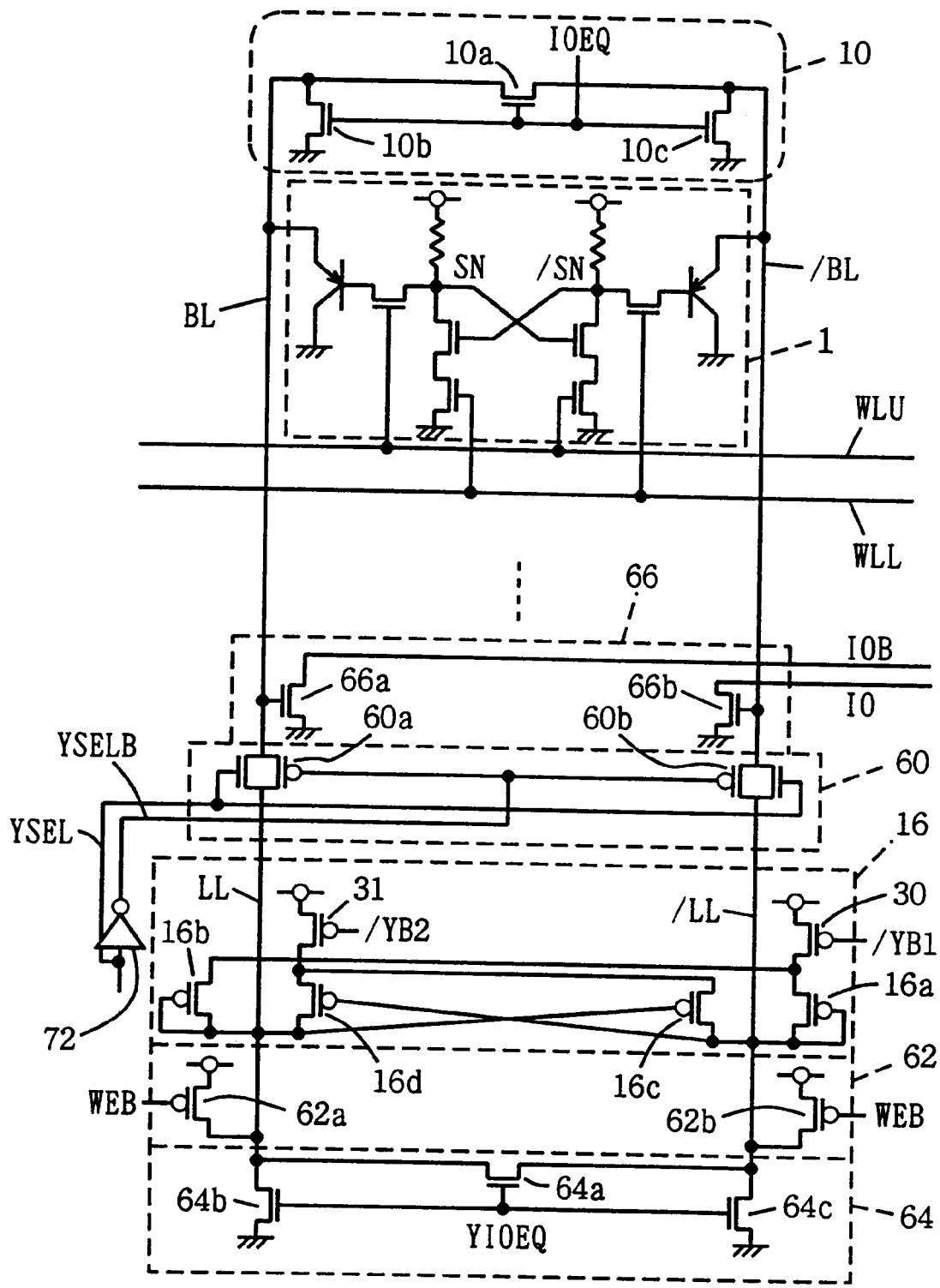
FIG. 16 schematically shows a structure of a portion related to a pair of bit lines in the semiconductor memory device in accordance with the third embodiment of the present invention.

FIG. 16 shows a structure of a portion related to one column of memory cells in the structure shown in FIG. 15. Referring to FIG. 16, precharge circuit 10 includes an n channel MOS transistor 10a which is rendered conductive when equalize instructing signal IOEQ is activated, for electrically short-circuiting bit lines BL and /BL, and n channel MOS transistors 10b and 10c which are rendered conductive when equalize instructing signal IOEQ is activated, for transmitting an L level voltage at the level of the ground voltage, to bit lines BL and /BL. Consequently, bit lines BL and /BL are precharged to the L level before data writing and data reading.

Column selection gate 60 includes a CMOS transmission gate 60a provided for bit line BL, and a CMOS transmission gate 60b provided for bit line /BL. To control electrode nodes of CMOS transmission gates 60a and 60b, a column selection signal YSEL output from a column decoder, not shown, and an inverted column selection signal YSELB from an inverter 72 inverting the column selection signal are applied. Therefore, only the bit lines provided corresponding to the column designated by column selection signal YSEL are electrically connected to the corresponding load bus LL and ILL.

Read load circuit 16 has the same structure as that of the first or second embodiment above, and it includes a p channel MOS transistor 30 which is activated in response to read enable signal /YBI for supplying current from a voltage source, a p channel MOS transistor 31 which is rendered conductive when read enable signal /YB2 is activated, for supplying current from the voltage source, diode connected p channel MOS transistors 16b and 16a supplied with current from transistor 30 and supplying current to load bus LL and /LL, and cross coupled p channel MOS transistors 16c and 16d supplied with current from transistor 31 for differentially amplifying and latching potentials of load bus LL and /LL. These structures are the same as those in the first embodiment above.

Write gate 62 includes p channel MOS transistors 62a and 62b which are rendered conductive when write enable signal WEB is activated for supplying current from the voltage source to load bus LL and /LL. Therefore, at the time of data writing, load bus LL and /LL are precharged to the H level.

Precharge circuit 64 includes an n channel MOS transistor which is rendered conductive when precharge instructing signal YIOEQ is activated, for electrically short-circuiting load bus LL and /LL, and n channel MOS transistors 64b and 64c which are rendered conductive when equalize instructing signal YIOEQ is activated, for driving the load bus LL and /LL to the level of the ground voltage.

Here, precharge circuit 64 is provided also for load bus LL and /LL. This is because load buses of non-selected columns are also precharged to the H level at the time of data writing and it is necessary to precharge these lines to the original potential of L level. Further, at the time of data reading, load bus LL and /LL are all driven to the H level (for non-selected columns) as read load circuit 6 is activated by enabling signals /YB1 and /YB2, and therefore it is necessary to precharge the buses to the original potential of L level.

Read gate 66 includes an n channel MOS transistor 66 connected between common read data bus line IOB and a ground node and having its gate connected to bit line BL, and an n channel MOS transistor 66b connected between common read data bus line IO and the ground node, and having its gate connected to bit line /BL. Therefore, the read gate 66 differentially amplifies potentials of bit lines BL and /BL, for transmission to read data bus lines IO and IOB.

In the structure of the bit lines shown in FIG. 16, similar operation as in the first and second embodiments is performed (what is different is that column selection gate 60 is interposed). Reading operation is performed in bit lines BL and /BL as well as load buses LL and /LL corresponding to the selected column. Bit lines BL and /BL corresponding to the non-selected column are disconnected from load bus lines LL and /LL, and bit lines BL and /BL are kept at the precharge potential of L level. Meanwhile, there is not a potential difference generated between load bus LL and /LL corresponding to the non-selected column, since charging is performed by read load circuit 16, and therefore these bus lines are kept at the same voltage level (H level).

Figure 17:
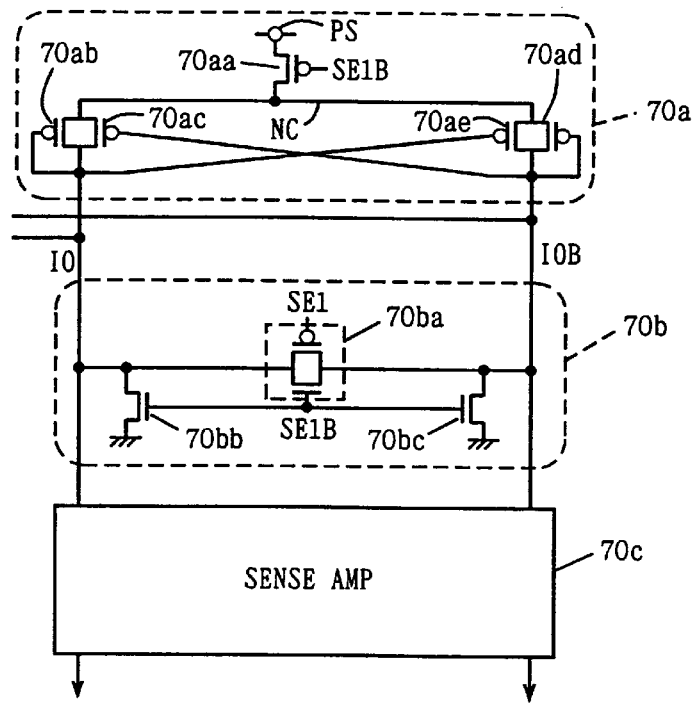
FIG. 17 shows a structure of a read amplifying circuit shown in FIG. 15.

FIG. 17 schematically shows the structure of read amplifying circuit 70 shown in FIG. 15. Referring to FIG. 15, read amplifying circuit 70 includes a preamplifier circuit 70a activated in response to activation of amplification enable signal SE1B, for differentially amplifying potentials of common read data bus lines IO and IOB, a data bus precharge circuit 70b activated when read enable signal SE1B is inactivated, for precharging common read data bus lines IO and IOB to the L level potential, and a sense amplifier 70c responsive to sense activation signal for further amplifying the potentials on common read data bus lines IO and IOB for transmission to an output circuit. The structure of sense amplifier 70c is the same as the conventional one.

Preamplifier circuit 70a includes: a p channel MOS transistor connected between a power supply node PS and a node NC and receiving at its gate a preamplifier amplification enable signal SEIB; a p channel MOS transistor 70ab connected between node NC and common data bus line IO and having its gate connected to common data bus line IO; a p channel MOS transistor 70ac connected between node NC and common data bus line IO and having its gate connected to common read data bus line IOB; a p channel MOS transistor 70ab connected between node NC and common read data bus line IOB and having its gate connected to common read data bus line IOB; and a p channel MOS transistor 70ae connected between node NC and common read data bus line IOB and having its gate connected to common read data bus line IO.

Figure 18:
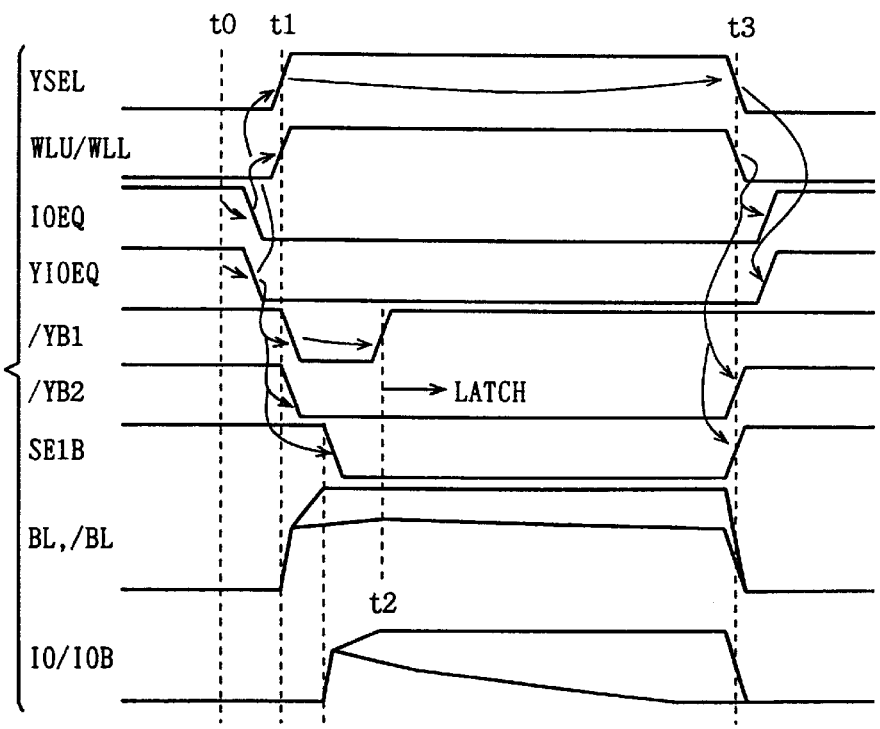
FIG. 18 is a diagram of signal waveforms showing data read operation sequence of the semiconductor memory device in accordance with the third embodiment of the present invention.

Read data bus precharge circuit 70b includes a CMOS transmission gate 70ba activated when preamplifier enable signals SE1 and SE1B are inactivated, for electrically short-circuiting common data bus IO and IOB, and n channel MOS transistors 70bb and 70bc rendered conductive in response to inactivation of preamplifier enable signal SE1b for discharging common read data bus IO and IOB to the potential level of L level. By using CMOS transmission gate as an equalizing element, imbalance between voltages of common read data bus lines IO and IOB is suppressed (when one MOS transistor is used, it is likely to occur that potential difference is generated between data bus lines IO and IOB because of channel resistance of the transistor). Data reading operation of the SRAM shown in FIGS. 16 and 17 will be described with reference to the diagram of signal waveforms of FIG. 18.

At time t0, an address signal is applied, change in the address is detected, and equalize instructing signals IOEQ and YIOEQ which have been active are set from the H level to the inactive state of L level. Consequently, precharge circuits 10 and 64 are inactivated, and precharging of bit lines BL and /BL as well as load data bus LL and /LL to the L level is completed.

In response to inactivation of equalize instructing signals IOEQ and YIOEQ, column selecting operation and row selecting operation are performed simultaneously, column selection signal YSEL rises to the H level and word lines WLU and WLL corresponding to the selected row both rise to the H level. Consequently, approximately at the same time as the rise of potentials of word lines WLU and WLL, bit lines BL and /BL are electrically connected to load data bus lines LL and /LL.

Thereafter, at time t1, in response to inactivation of equalize instructing signals IOEQ and YIOEQ, data read enable signals /YB1 and /YB2 are set to the active state of L level, read load circuit 16 is activated, and supplies current to bit lines BL and /BL through load bus LL and /LL as well as through column selection gate 60. When potentials of bit lines BL and /BL rise to be higher than the emitter-to-base potential of the bipolar transistor in the selected memory cell, collector current flows through the bipolar transistor which has its base connected to the storage node storing data of L level, and increase in potential of the bit line is suppressed.

Assume that storage node SN holds data of H level and storage node /SN stores data of L level, in FIG. 16. In this state, increase in potential of bit line /BL is suppressed, while the potential of bit line BL is driven to the H level. As the potential of bit line BL increases, amount of current supply of p channel MOS transistor 16b in read load circuit 16 decreases, and as the potential of bit line /BL increases, amount of current supply of p channel MOS transistor 16b also decreases, so that speed of increase of the potential of bit line BL becomes slow. Meanwhile, amount of current supply of MOS transistor 16c decreases, and current is supplied to bit line /BL through MOS transistor 16a. Therefore, the speed of increase of the potential is very slow, because of the collector current of the bipolar transistor.

Because of the potential difference between bit lines BL and /BL, there is generated difference in conductances of MOS transistors 66a and 66b of read gate 66. In this state, preamplifier enabling signal SE1b is still at the inactive state of H level, common data bus precharge circuit 70b is active, and common read data bus lines IO and IOB are held at the potential of L level.

When potential difference between bit lines BL and /BL becomes sufficiently large, preamplifier enabling signal SE1B is set to the active state of L level, precharging of common read data bus IO and IOB is completed, and preamplifier circuit 70a is activated. By the preamplifier circuit 70a, current is supplied to common read data bus IO and IOB, and potentials of common read data bus IO and IOB increases. At this time, charging is performed in preamplifier circuit 70a by MOS transistors 70ab to 70ae, and therefore the potential increases at high speed. When potentials on common read data bus IO and IOB attain to a certain level, feedback operation of cross coupled p channel MOS transistors 70ac and 70ae is weakened and current supplying capabilities of diode connected p channel MOS transistors 70ab and 70ad are reduced in preamplifier circuit 70a.

Now, the potential of bit line BL is at the H level and the potential of bit line /BL is at the L level. In this state, MOS transistor 66b of read gate 66 cannot fully discharge currents supplied from MOS transistors 70ab and 70ac, and therefore potential on common read bus line IO increases moderately. As the potential of common read data bus line IO increases, gate potential of MOS transistor 70ae increases in preamplifier circuit 70a, amount of current supply thereof decreases, and common read data bus IOB is charged by the diode connected MOS transistor 70ad. MOS transistors 70ab and 70ae constitute a current mirror circuit, and MOS transistors 70ad and 70ac constitute a current mirror circuit. Therefore, current from MOS transistor 70aa for activating preamplifier is shunted into MOS transistors 70ab and 70ac as well as to MOS transistors 70ae and 70ab. When the potential of common read data bus line IOB decreases, gate potential of MOS transistor 70ac decreases, supplying large current, and therefore potential of common read data bus line IO is increased to the H level. When common read data bus line IO attains to the H level, MOS transistor 70ab is rendered non-conductive, and MOS transistor 70ae is rendered non-conductive in response. Accordingly, the potential of common read bus line IO is maintained at the H level, while the potential of common read data bus line IOB is eventually lowered to the L level corresponding to the level of the ground potential.

At time t2, enabling signal /YB1 is inactivated and read load circuit 16 is set to the latching state.

When the signal potential difference of common read data bus is sufficiently enlarged, sense amplifier 70c is activated, potentials on common read data bus IO and IOB are amplified to generate internal read data, which data is applied to an output circuit (not shown).

After a prescribed time period, at time t3, word lines WLU and WLL are both set to the inactive state, data read cycle is completed, and parallel to transition of word lines WLU and WLL to the non-selected state, column selection signal YSEL is also set to the inactive state of L level, column selection gate 60 is rendered nonconductive, and bit lines BL and /BL are disconnected from load data buses LL and /LL.

At time t3, preamplifier enabling signal SE1B is inactivated, and preamplifier circuit 70a is inactivated.

Thereafter, at a prescribed timing, equalize instructing signals IOEQ and YIOEQ are inactivated, and bit lines BL and /BL as well as load data bus lines LL and /LL are precharged to the L level. Common read data bus lines IO and IOB are precharged to the L level by precharge circuit 70b in response to inactivation of preamplifier enabling signal SE1B.

To read data bus IO and IOB, read gates of non-selected bit lines are connected. However, non-selected bit line pairs are held at the L level, and therefore read gates are non-conductive. Therefore, read gates do not exert any influence on data reading from the selected bit line pair.

At the time of data writing, write enable signal WEB is activated, the bit line which has been precharged to the L level is driven to the H level, and potential of one of the word lines WLU and WLL is driven to the H level in accordance with the write data, whereby data is written.

Figure 19:
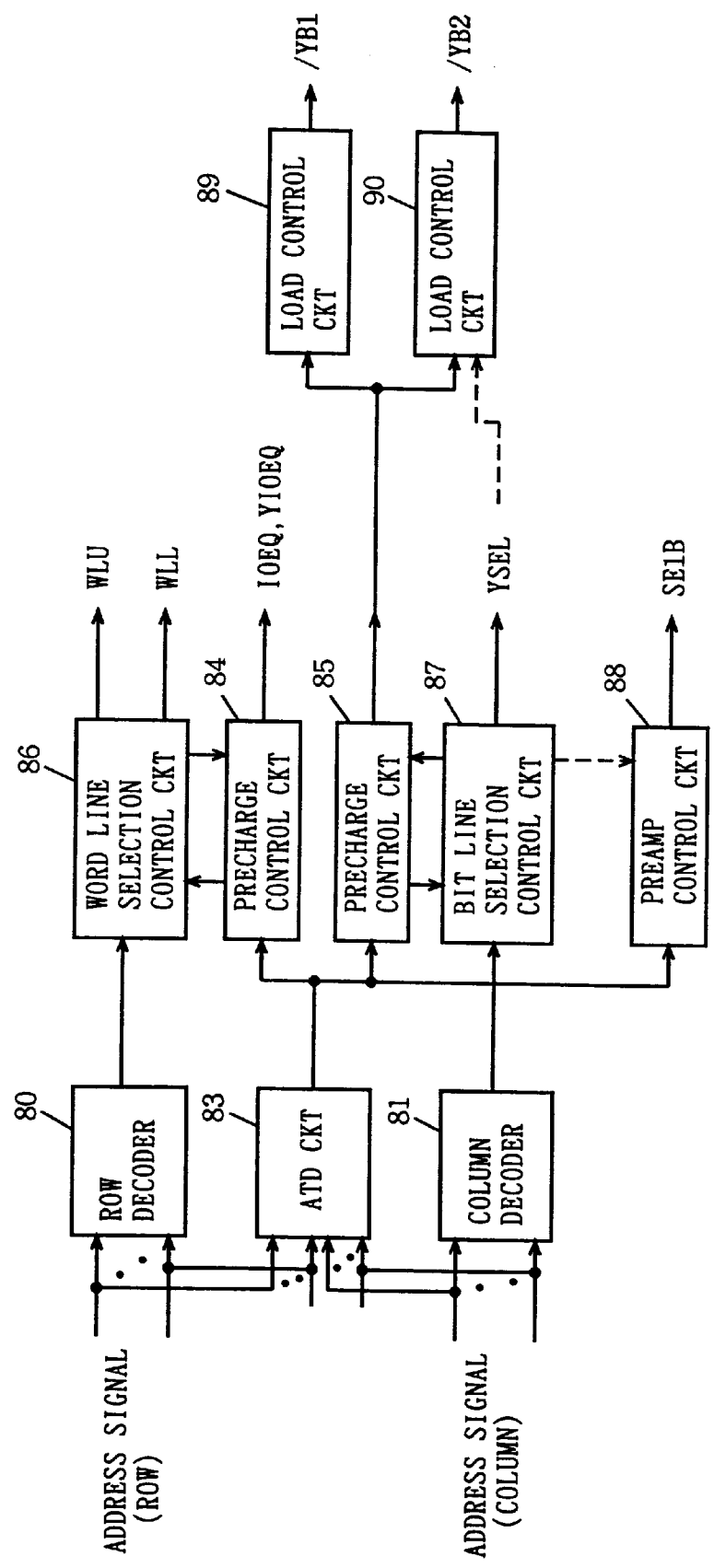
FIG. 19 schematically shows the structure of the control signal generating portion for realizing the read sequence shown in FIG. 18.

FIG. 19 schematically shows a structure of the control signal generating portion of the SRAM in accordance with the third embodiment of the present invention. Referring to FIG. 19, the control signal generating portion includes: a row decoder 80 for decoding an applied address signal (row address signal) for generating a signal for selecting a word line corresponding to the addressed row; a column decoder 81 receiving and decoding an externally applied address signal (column address signal) for generating a column designating signal for selecting a bit line pair corresponding to the addressed column; an ATD (address transition detection) circuit 83 receiving externally applied address signal (row and column address signals) for detecting a transition thereof; a precharge control circuit 84 for driving bit line equalize instructing signal IOEQ to the inactive state of L level in accordance with an address transition detection signal from ATD circuit 83; a precharge control circuit 85 for driving load data bus precharge signal YIOEQ to the active state in accordance with the address transition detection signal from ATD circuit 83; a word line selection control circuit 86 for driving a pair of word lines corresponding to the addressed row to the selected state in accordance with a word line designating signal from row decoder 80 in response to activation of precharge instructing signal IOEQ from precharge control circuit 84; and a bit line selection control circuit 87 for outputting a column selection signal YSEL for selecting bit lines corresponding to the addressed column, in accordance with a column designating signal from column decoder 81, in response to activation of precharge instructing signal YIOEQ from precharge control circuit 85.

The structure of word line selection control circuit 88 includes write/read control circuit (6, 35) and word line drive circuit 7 shown in FIG. 11. Bit line selection control circuit 87 drives the column selection signal YSEL to the active state for a prescribed period in response to inactivation of precharge instructing signal YIOEQ. Word line selection control circuit 86 drives the selected word lines WLU and WLL to the selected state for a prescribed time period. After the lapse of the prescribed time period, word line selection control circuit 86 drives the selected word lines to the inactive state, and precharge control circuit 84 drives bit line equalize instructing signal IOEQ to the active state, in accordance with word line inactivation indication from word line selection control circuit 86.

Precharge control circuit 865 drives the load data bus precharge instructing signal IOEQ to the active state, in response to inactivation of column selection signal YSEL from bit line selection control circuit 87. Therefore, precharge control circuits 84 and 85 can be formed of a flipflop, and word line selection control circuit 86 and bit line selection control circuit 87 may be formed by using a one shot pulse generating circuit.

The control signal generating portion further includes a preamplifier control circuit 88 responsive to the address transition detection signal from ATD circuit 83 for driving, after the lapse of a prescribed time period, preamplifier activating signal SE1B to the active state, and load control circuits 89 and 90 responsive to inactivation of load data bus precharge instructing signal YIOEQ for driving read enable signals /YB1 and /YB2 to the active state, respectively. Load control circuits 89 and 90 are each formed of a one shot pulse generating circuit, and drives the memory cell data read enable signals /YB1 and /YB2 to the active state of L level for a prescribed time period.

As for the structure of preamplifier control circuit 88, one in which preamplifier enable signal SE1B is driven to the inactive state in response to inactivation of column selection signal YSEL from bit line selection control circuit 87 may be used, as an alternative to the structure for generating preamplifier enable signal SE1B which is kept active for a prescribed time period (the alternative path is represented by the dotted line). As for the structure of load control circuit 90, one in which memory cell data read enable signal /YB2 is driven to the inactive state in response to inactivation of column selection signal YSEL may be used.

As described above, according to the third embodiment of the present invention, memory cells of each bit line pair and the read load circuit are adapted to be selectively connected to each other through a transfer gate. Therefore, it is possible to connect the bit lines and the load data buses (read load circuits) selectively by using the transfer gates. Accordingly, read load circuits provided for respective bit line pairs can be commonly controlled for the bit line pairs, which facilitates layout of interconnections and reduces area occupied by the interconnection lines. Further, effects similar to those of the first embodiment can be provided.

[Fourth Embodiment]

Figure 20:
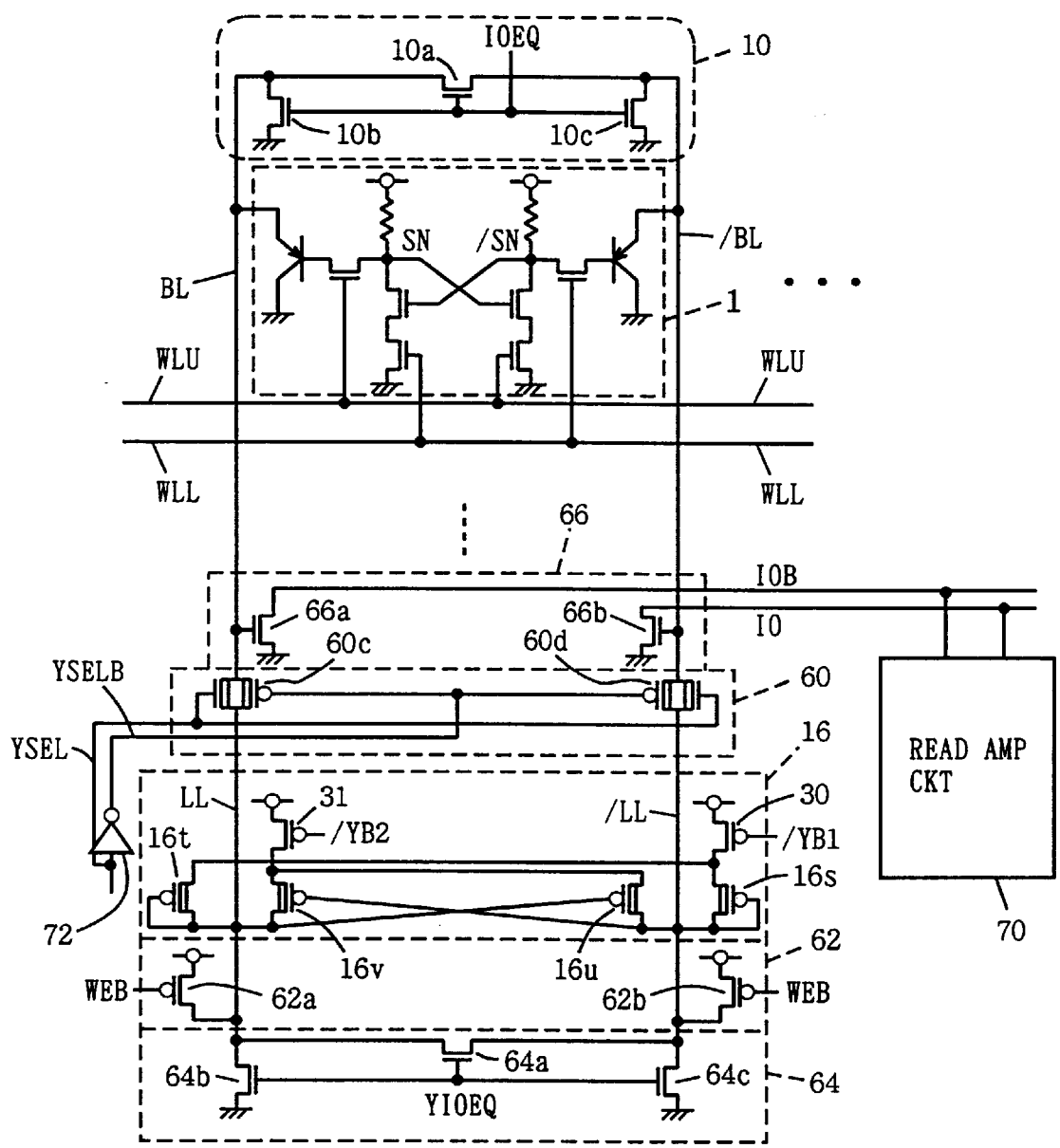
FIG. 20 schematically shows a main structure of a semiconductor memory device in accordance with a fourth embodiment of the present invention.

FIG. 20 shows a structure of a main portion of the SRAM in accordance with the fourth embodiment of the present invention. The structure shown in FIG. 20 differs from the structure of the third embodiment shown in FIGS. 16 and 17 in the following points. Namely, the absolute values of threshold voltages of MOS transistors which are components of CMOS transmission gates 60c and 60d included in column selection gate 60 for connecting bit lines BL and /BL to corresponding load data bus lines LL and /LL are made smaller than those of access transistors or driver transistors of the memory cell or of transistors 66a and 66b of the read gate.

Further, absolute values of the threshold voltages of diode connected p channel MOS transistors 16s and 16t as well as cross coupled p channel MOS transistors 16u and 16v of read load circuit 16 are made smaller than those of other components (except the column selection gate). The absolute value of the threshold voltage of a component of column selection gate 60 and read load circuit 16 may be made smaller than the absolute value of the threshold voltage of not only the transistors in the memory cell but also of MOS transistors included in other peripheral circuitry, for example equalize circuits 10 and 64.

Except for these points, the structure is the same as that of the third embodiment shown in FIGS. 16 and 17. Corresponding portions are denoted by the same reference characters and detailed description thereof is not repeated.

In the structure shown in FIG. 20, as the absolute value of the threshold voltage of the MOS transistor, which is a component of column selection gate 60, is made smaller, CMOS transmission gates 60c and 60d can be rendered conductive at a fast timing to connect bit lines BL and /BL to the corresponding load data bus lines LL and /LL when column selection signals YSEL and YSELB are changed, whereby high speed reading becomes possible. Further, since the absolute value of the threshold voltage is made smaller, it is possible to reduce channel resistance (to increase conductance) provided that the voltage level of column selection signal YSEL is the same as the conventional one, current can be supplied at high speed from load data bus lines LL and /LL to bit lines BL and /BL, and therefore potentials of bit lines BL and /BL can be changed at high speed.

Since absolute value of the threshold voltage of MOS transistors 16s, 16t, 16u and 16v of read load circuit 16 is made smaller, it becomes possible to lower the lower limit of the operational power supply voltage with which the read load circuit 16 operates, and therefore data can be read stably even under low power supply voltage (as in the second embodiment). Even when the operational power supply voltage is lowered, the absolute value of the threshold voltage of the MOS transistor, which is a component of column selection gate 60, is also made smaller, and therefore column selection gate 60 is surely rendered conductive, and bit lines BL and /BL are surely connected to load data bus lines LL and /LL. Accordingly, an SRAM of which data reading is ensured even under low power supply voltage is realized.

When only the absolute value of the threshold voltage of MOS transistor in column selection gate 60 is made smaller, it is possible to exchange signals between the bit lines and the load data bus at high speed, allowing high speed reading.

As described above, according to the fourth embodiment of the present invention, the absolute values of threshold voltages of MOS transistors constituting the column selection gates for connecting bit lines and load data bus as well as p channel MOs transistors constituting the read load circuit are made smaller, and therefore stable operation is ensured even under low power supply voltage. Further, as the column selection gate has low threshold voltage, signal potential can be transmitted at high speed between the bit lines and the read load data bus, enabling high speed reading.

[Fifth Embodiment]

Figure 21:
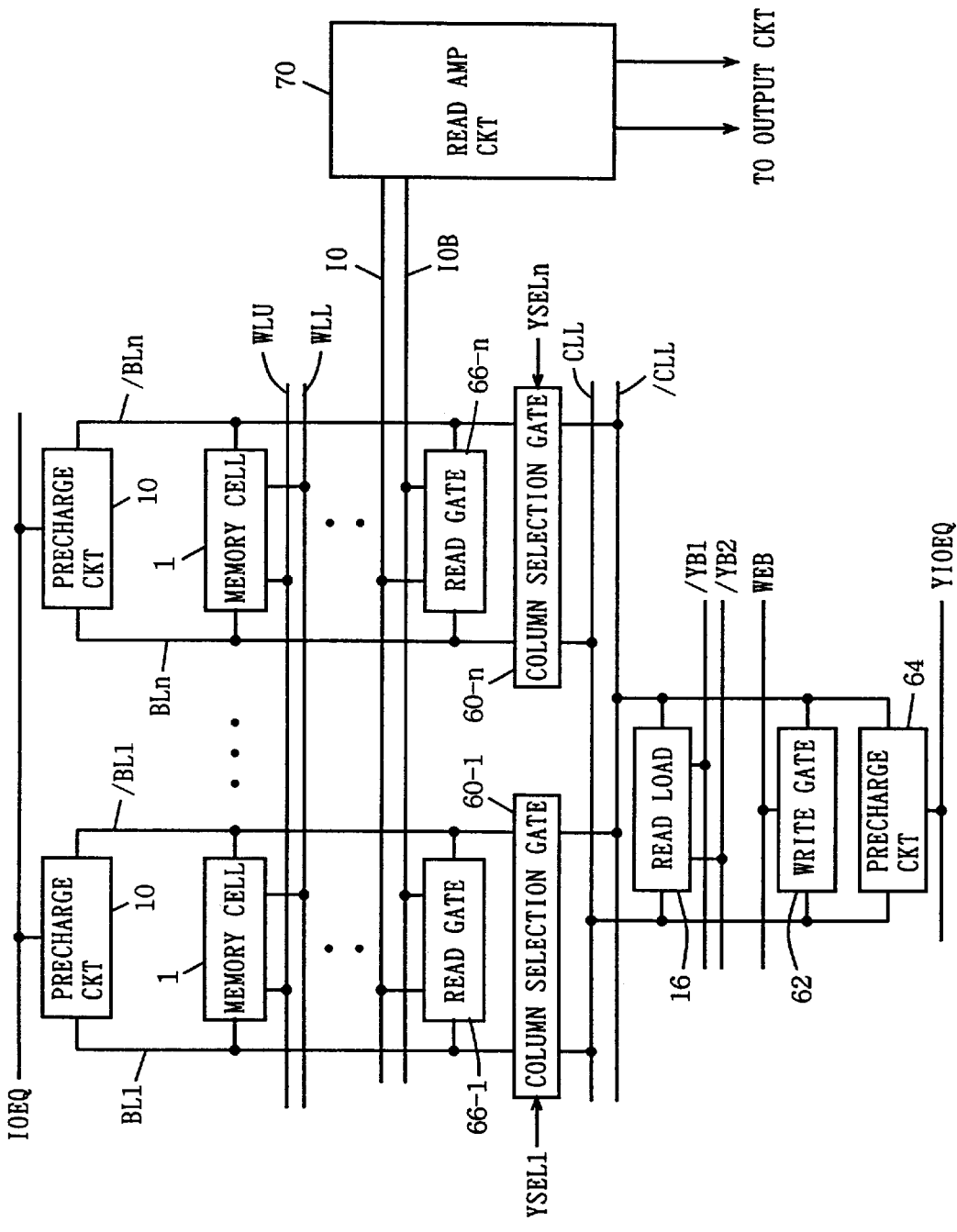
FIG. 21 schematically shows a main structure of a semiconductor memory device in accordance with a fifth embodiment of the present invention.
Figure 22:
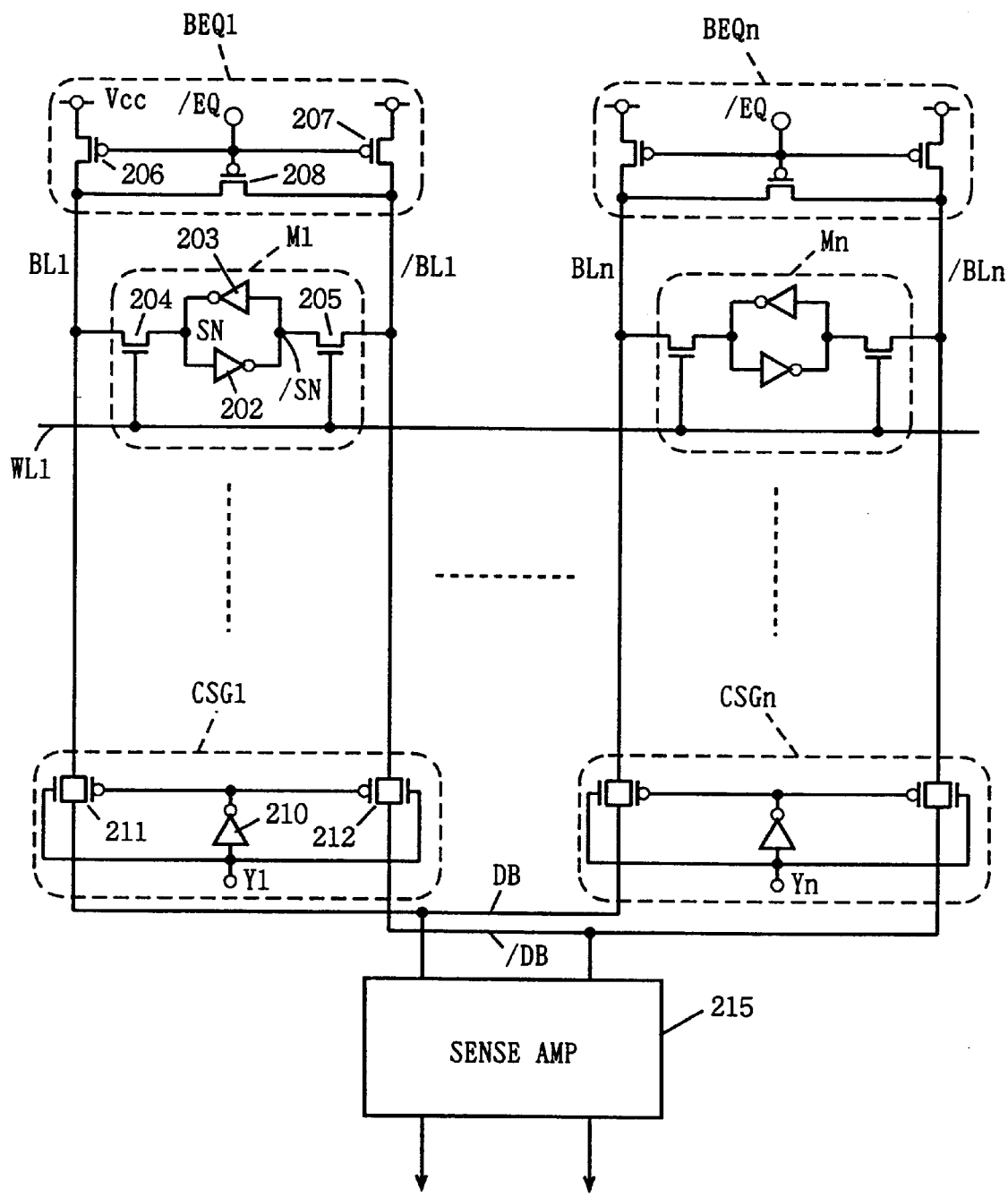
FIG. 22 schematically shows the structure of an array portion of a conventional static random access memory.
Figure 23:
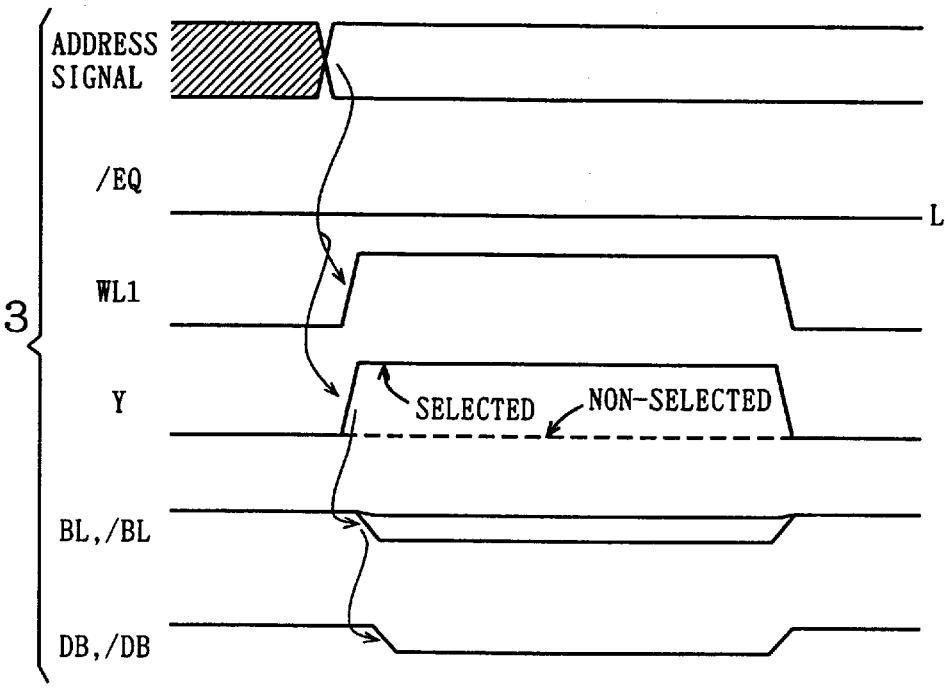
FIG. 23 is a diagram of waveforms representing data read operation of the conventional static random access memory.
Figure 24:
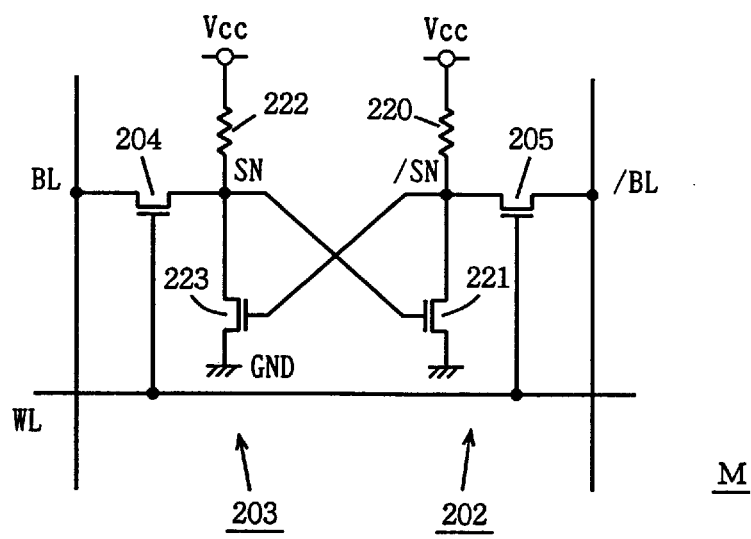
FIG. 24 shows an example of a structure of the conventional static random access memory.
Figure 25A:
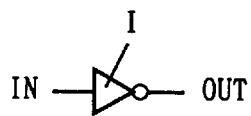
FIG. 25A shows a structure of an inverter and FIG. 25B shows input/output transfer characteristic of the inverter.
Figure 25B:
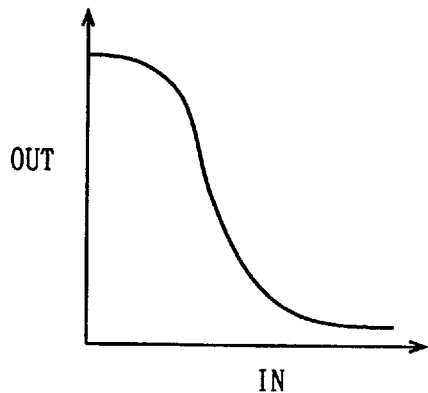
Figure 26A:
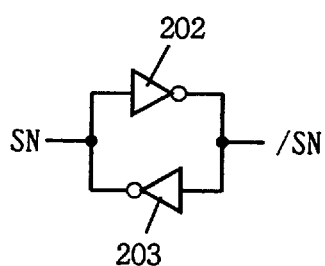
FIG. 26A shows a structure of an inverter latch.
Figure 26B:
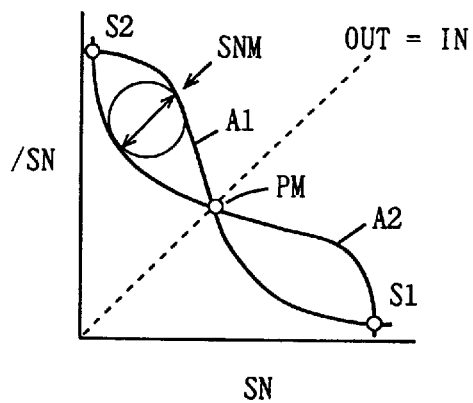
FIG. 26B shows input/output transfer characteristic of the inverter latch.
Figure 27A:
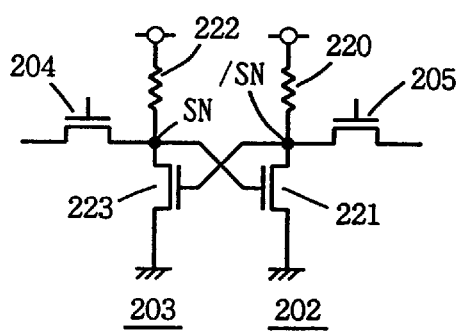
FIG. 27A shows state of connection of the SRAM at the standby state, and FIG. 27B schematically shows the input/output transfer characteristic of the memory cell.
Figure 27B:
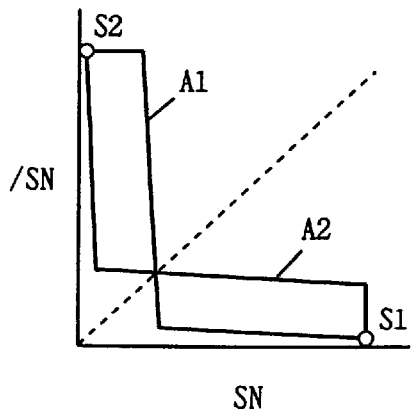
Figure 28A:
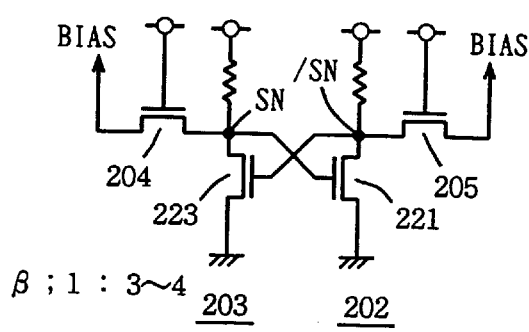
FIG. 28A shows the state of connection of the memory cell when the memory cell is selected.
Figure 28B:
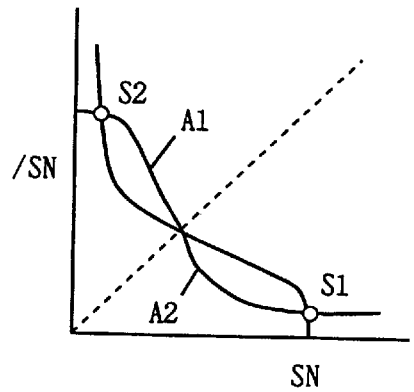
FIG. 28B shows data input/output transfer characteristic when the memory cell is selected.
Figure 28C:
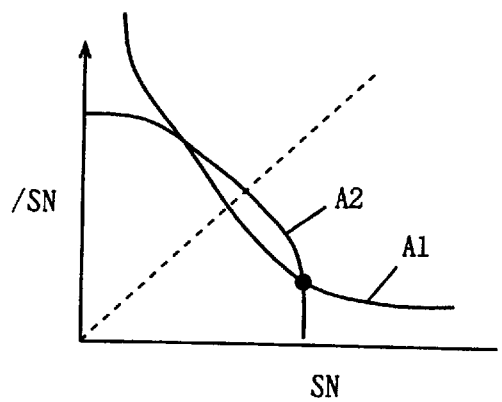
FIG. 28C shows the data input/output transfer characteristic of the memory cell when cell ratio is small.
Figure 28D:
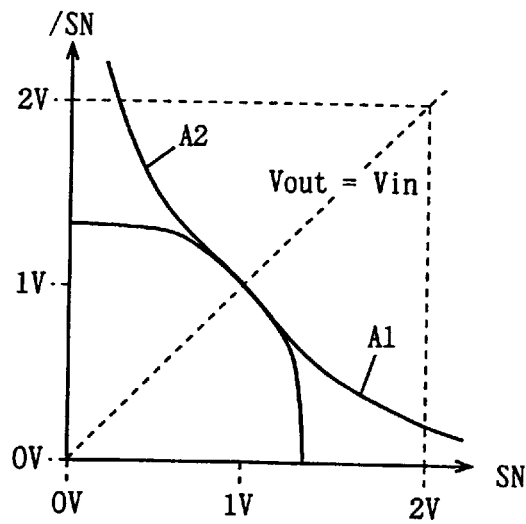
FIG. 28D shows input/output data transfer characteristic of the inverter latch of the memory cell with low power supply voltage.

FIG. 21 shows a structure of a main portion of the SRAM in accordance with the fifth embodiment of the present invention. The structure shown in FIG. 21 differs from the structure shown in FIGS. 15 to 17 and FIG. 20 in the following point. More specifically, common load data bus lines CLL and /CLL are arranged common to the plurality of bit lines BL1, /BL1 to BLn, /BLn. The common load data bus lines CLL and /CLL are electrically connected to bit lines BL1, /BL1 to BLn, /BLn through column selection gates 60-1 to 60-n, respectively.

For the common load data bus lines CLL and /CLL, read load circuit 16, write gate 62 and precharge circuit 64 are provided. Read load circuit 16, write gate 62 and precharge circuit 64 have the same structures as shown in FIG. 16 or 20. Corresponding portions are denoted by the same reference characters and detailed description thereof is not repeated.

In the structure shown in FIG. 21, only that pair of bit lines which is selected by column selection signals YESL1 to YSELn is connected to the common load data bus CLL and /CLL. Other non-selected bit line pairs are kept at the precharge state of L level, as the corresponding column selection gates are non-conductive. Only the selected bit line pair is connected to read load circuit 16 and data is read. Operations at the time of data reading and writing are the same as those of the third embodiment above.

As shown in FIG. 21, since common load data bus lines CLL and /CLL are provided, only one read load circuit 16, one write gate 62 and precharge circuit 64 have only to be provided for the plurality of bit line pairs, and area of occupation by the load circuit for data writing/reading can be reduced significantly. Further, there is only one write/read load circuit (read load circuit 16, write gate 62 and precharge circuit 64), and therefore load of a control signal controlling operations of the circuit can be reduced, enabling high speed driving of write/read load circuit. In response, loads of signal lines for the signals /YB1, /YB2, WEB and YIOEQ are reduced, and therefore loads on the portions generating these signals are reduced. Thus, components of these circuits may be reduced in size, and accordingly, layout area can be reduced. Similar effects as in the third embodiment are also provided.

Though structures of column selection gates 60-1 to 60-n and of read load circuit 66 have been described as identical to the structures of FIG. 16 or FIG. 20, it is possible to increase conductance of a transfer gate (CMOS transmission gate) constituting column selection gates 60-1 to 60-n by decreasing absolute value of the threshold voltage of the MOS transistor constituting the transfer gate, so as to enable high speed signal transmission and high speed data writing/reading.

By making smaller in absolute value the threshold voltages of diode connected p channel MOS transistors and cross coupled p channel MOS transistors included in read load circuit 6, high speed data writing/reading is possible even under low power supply voltage, as in the fourth embodiment.

[Other Applications]

In the above described embodiments, an SRAM has been described as an example of the static semiconductor memory devices. However, the SRAM may be integrated on one chip together with other logics, or it may integrated on one semiconductor chip together with other memory such as a dynamic random access memory (DRAM), provided that the SRAM has a structure for statically storing information. Further, the SRAM may be a memory device which operates in synchronization with an external clock signal, for example, a system clock.

As described above, in the semiconductor memory device in accordance with the present invention, a memory cell is formed by bipolar transistors and a cross coupled type flipflop, and at the time of data reading, bit lines are driven by activating a read load circuit including diode connected transistors and cross coupled transistors. Therefore, only the base current of the bipolar transistor flows to the memory cell, and therefore even under low power supply voltage, data can be held stably. Further, since current is supplied to the bit lines using cross coupled transistors and diode connected transistors, latching of erroneous bit line potentials derived from imbalance in potential and capacitance of bit lines at the start of data reading can be prevented, whereby accurate data reading is ensured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    a word line;
    a pair of bit lines arranged crossing said word line;
    a memory cell arranged corresponding to a crossing portion between said word line and said pair of bit lines, said memory cell including a cross coupled type flipflop for storing complementary data at a pair of storage nodes, a pair of bipolar transistors provided corresponding to said pair of bit lines, respectively and each having one conduction node connected to a corresponding bit line, and a pair of access transistors responsive to a signal potential on said word line for coupling the pair of storage nodes of said cross coupled type flipflop to base electrodes of said pair of bipolar transistors, respectively; and
    a read load circuit coupled to said pair of bit lines for reading and amplifying data of said memory cell to said pair of bit lines at a time of data reading, said read load circuit including a pair of diode elements connected to said pair of bit lines respectively, a pair of cross coupled transistors for differentially amplifying and latching potentials of said pair of bit lines, a first switching transistor for electrically connecting said pair of diode elements to a power source supplying a first power supply voltage, and a second switching transistor for electrically connecting said pair of cross coupled transistors to said power source.

2. The semiconductor memory device according to claim 1, further comprising
    a bit line precharge circuit coupled to said pair of bit lines, for precharging, in a data read mode, said pair of bit lines to a voltage level different from said first power supply voltage before activation of said read load circuit.

3. The semiconductor memory device according to claim 1, further comprising
    means responsive to an applied data read instruction for simultaneously activating said first and second switching transistors in data reading, and thereafter maintaining said second switching transistor conductive and maintaining said first switching transistor nonconductive.

4. The semiconductor memory device according to claim 1, wherein
    said cross coupled transistors and diode elements include insulated gate type field effect transistors of a common conductivity type.

5. The semiconductor memory device according to claim 1, wherein
    each of said cross coupled transistors and diode elements includes an insulated gate type field effect transistor having a first threshold voltage, and
    the cross coupled type flipflop of said memory cell includes an insulated gate type field effect transistor having a second threshold voltage larger in absolute value than said first threshold voltage.

6. The semiconductor memory device according to claim 1, further comprising
    a transfer gate provided between said read load circuit and said memory cell on said pair of bit lines, and rendered conductive in response to a bit line selection signal, for electrically coupling said memory cell and said read load circuit.

7. The semiconductor memory device according to claim 6, wherein
    said transfer gate includes an insulated gate type field effect transistor, and said cross coupled type flipflop of said memory cell includes an insulating gate type field effect transistor having a threshold value larger in absolute value than the threshold value of the insulated gate type field effect transistor of said transfer gate.

8. The semiconductor memory device according to claim 1, further comprising
    transition detection means receiving an address signal and an access instructing signal and detecting a transition in at least one of the received signals for generating a first pulse signal of a first pulse width;
    read instruction means receiving said access instructing signal for generating a data read instructing signal when the received access instructing signal instructs a data read access operation;
    pulse generation means coupled to said transition detection means and responsive to said first pulse signal received therefrom for generating a second pulse signal of a second pulse width and a third pulse signal of a third pulse width longer than said second pulse width; and
    control means responsive to said data read instructing signal received from said read instruction means and the second and third signals received from said pulse generation means for generating a first control signal for rendering said first switching transistor conductive during the second pulse width period and a second control signal for rendering said second switching transistor conductive during the third pulse width period when said data read instruction signal is active.

9. The semiconductor memory device according to claim 8, wherein said third pulse width defines a time period of activation of the word line.

10. The semiconductor memory device according to claim 8, wherein said access instructing signal includes a chip select signal instructing that data access is made and an operation mode designating signal designating which of data read and data write is performed.

11. A semiconductor memory device, comprising:

a plurality of bit line pairs;

a plurality of word lines arranged crossing said plurality of bit line pairs;

a plurality of memory cells provided corresponding to crossing portions between said plurality of bit line pairs and said plurality of word lines, and each storing data, each of said plurality of memory cells including a cross coupled type flipflop for storing complementary data at a pair of storage nodes, a pair of bipolar transistors provided corresponding to the bit lines of respective bit line pairs and each having one conduction node connected to a corresponding bit line, and a pair of access transistor responsive to a signal potential of a corresponding word line for coupling the pair of storage nodes of said cross coupled type flipflop to base electrodes of said pair of bipolar transistors;

bit line selecting means for selecting, in accordance with a bit line selection signal, a bit line pair designated by said bit line selection signal out of said plurality of bit line pairs; and read load means coupled to the bit line pair selected by said bit line selecting means, for reading and amplifying data of a selected memory cell to said selected bit line pair, said read load means including at least one pair of read load bus lines coupled to said selected bit line pair, a pair of diode elements respectively connected to said pair of read load bus lines, a pair of cross coupled transistors for differentially amplifying and latching signal potentials on said pair of read load bus lines, a first switching transistor for electrically connecting said pair of diode elements to a power source supplying a first power supply voltage, and a second switching transistor for electrically connecting said pair of cross coupled transistors to said power source.

12. The semiconductor memory device according to claim 11, wherein said read load means includes a plurality of read load circuits provided corresponding to said plurality of bit lines and each including said pair of read load bus lines, and said bit line selecting means includes a transfer gate provided for each of said plurality of bit line pairs and for connecting, when said bit line selection signal selects a corresponding bit line pair, the corresponding bit line pair to the pair of read load bus lines of the corresponding read load circuit.

13. The semiconductor memory device according to claim 11, wherein said read load means includes one read load circuit provided in common to said plurality of bit line pairs, and a pair of said read bus lines, and said bit lines selecting means includes a plurality of transfer gates provided corresponding to the respective bit line pairs, for connecting, when said bit line selection signal selects a corresponding bit line pair, the corresponding bit line pair to said pair of read load bus lines.

14. The semiconductor memory device according to claim 11, further comprising means responsive to a data read access instruction for controlling said first and second switching means such that the pair of diode elements and the pair of cross coupled transistors of said read load means are coupled to said power source and, after a prescribed time period, said pair of diode elements are disconnected from said power source while said pair of cross coupled transistors are kept coupled to said voltage source.

15. The semiconductor memory device according to claim 11, further comprising precharge means for precharging, when said bit line selection signal is inactive, each bit line of said plurality of bit line pairs to a prescribed voltage level different from said first power supply voltage.

16. The semiconductor memory device according to claim 11, wherein said pair of cross coupled transistors and said diode elements are formed of insulated gate type field effect transistors of a common size.

17. The semiconductor memory device according to claim 11, wherein each of said pair of cross coupled transistors and said diode elements is formed of an insulated gate type field effect transistor having a first threshold value, and said cross coupled type flipflop of each of the memory cell includes an insulated gate type field effect transistor having a threshold voltage larger in absolute value than said first threshold voltage.

18. The semiconductor memory device according to claim 12, wherein said transfer gate includes an insulated gate type field effect transistor, and the access transistor of the memory cell includes an insulated gate type field effect transistor having a threshold value larger in absolute value than the threshold value of the insulated gate type field effect transistor of said transfer gate.

19. The semiconductor memory device according to claim 11, further comprising:

a read data bus provided commonly for said plurality of bit line pairs;

a plurality of read gates provided for the respective bit line pairs, for differentially amplifying potentials of the corresponding bit line pair for transmission to said read data bus; and a read amplifying circuit activated in data reading, for amplifying a signal potential on said read data bus for generating an internal read data.

20. The semiconductor memory device according to claim 11, further comprising, read bus precharge means coupled to said at least one pair of read load bus lines, for precharging said at least one pair of read load bus to a voltage level different from said first power supply voltage when said bit line selection signal is inactive.

* * * * *